United States Patent
Naito

(10) Patent No.: US 10,256,303 B2
(45) Date of Patent: Apr. 9, 2019

(54) SEMICONDUCTOR DEVICE

(71) Applicant: FUJI ELECTRIC CO., LTD., Kanagawa (JP)

(72) Inventor: Tatsuya Naito, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 170 days.

(21) Appl. No.: 15/335,444

(22) Filed: Oct. 27, 2016

(65) Prior Publication Data

US 2017/0170273 A1 Jun. 15, 2017

(30) Foreign Application Priority Data

Dec. 14, 2015 (JP) ................. 2015-243077

(51) Int. Cl.
| | |
|---|---|
| *H01L 27/06* | (2006.01) |
| *H01L 29/06* | (2006.01) |
| *H01L 29/10* | (2006.01) |
| *H01L 29/739* | (2006.01) |
| *H01L 29/40* | (2006.01) |
| *H01L 29/423* | (2006.01) |

(52) U.S. Cl.
CPC ...... *H01L 29/0696* (2013.01); *H01L 27/0664* (2013.01); *H01L 29/1095* (2013.01); *H01L 29/404* (2013.01); *H01L 29/407* (2013.01); *H01L 29/4236* (2013.01); *H01L 29/4238* (2013.01); *H01L 29/42364* (2013.01); *H01L 29/7397* (2013.01)

(58) Field of Classification Search
None
See application file for complete search history.

(56) References Cited

U.S. PATENT DOCUMENTS

| | | | |
|---|---|---|---|
| 8,097,901 B2 * | 1/2012 | Koyama | H01L 29/0696 257/139 |
| 2002/0179976 A1 | 12/2002 | Takahashi | |
| 2013/0037853 A1 * | 2/2013 | Onozawa | H01L 29/0661 257/139 |
| 2014/0054645 A1 | 2/2014 | Saito et al. | |
| 2015/0206960 A1 | 7/2015 | Hirabayashi et al. | |

\* cited by examiner

*Primary Examiner* — Cory W Eskridge

(57) ABSTRACT

Provided is a semiconductor device including a plurality of dummy trench portions that are provided in a front surface side of a semiconductor substrate and each have provided therein an electrode to which an emitter potential is supplied, and a gate trench portion that is provided in a manner to surround two or more dummy trench portions from among the plurality of dummy trench portions in the front surface side of the semiconductor substrate and has provided therein an electrode to which a gate potential is supplied.

18 Claims, 21 Drawing Sheets

SEMICONDUCTOR DEVICE

The contents of the following Japanese patent application are incorporated herein by reference:
NO. 2015-243077 filed in JP on Dec. 14, 2015.

BACKGROUND

1. Technical Field

The present invention relates to a semiconductor device.

2. Related Art

A conventional semiconductor device is provided with a plurality of first gate trenches extending linearly in a planar view and second gate trenches in a floating state that extend parallel to the first gate trenches, as shown in Patent Document 1, for example. Also, in a conventional semiconductor device, a trench having a gate electrode therein is formed with a three-path pattern as seen in a planar view, and a unit pattern of this trench surrounds a dummy electrode having a floating potential, as shown in Patent Document 2 (see FIGS. 18 and 19), for example. In this way, a linear or three-path gate trench extends over a long distance within the semiconductor substrate.
Patent Document 1: Japanese Patent Application Publication No. 2015-138789
Patent Document 2: Japanese Patent Application Publication No. 2012-190938

The gate electrode in the gate trench creates a gate capacitance along with an emitter electrode and a collector electrode. In a case where the gate trench extends over a long distance in the semiconductor substrate, it is difficult to flexibly adjust the gate capacitance during the design stage.

SUMMARY

According to a first aspect of the present invention, provided is a semiconductor device comprising a plurality of dummy trench portions and a gate trench portion. The plurality of dummy trench portions may be provided in a front surface side of a semiconductor substrate. The plurality of dummy trench portions may each have provided therein an electrode. An emitter potential may be supplied to these electrodes. The gate trench portion may be provided in a manner to surround two or more dummy trench portions from among the plurality of dummy trench portions in the front surface side of the semiconductor substrate. The gate trench portion may have provided therein an electrode. A gate potential may be supplied to this electrode.

The semiconductor device may further comprise an emitter electrode and a gate runner. The emitter electrode may be arranged in a region where at least a portion of the gate trench portion is directly therebelow. The emitter electrode may have the emitter potential supplied thereto. The gate runner may have at least a portion thereof provided below the emitter electrode. The gate runner may be electrically connected to the electrode provided within the gate trench portion. The gate runner may extend in a direction toward an outer circumference from a region directly below the emitter electrode.

The gate trench portion and the dummy trench portions may be provided in an alternating manner in an extension direction of the gate runner.

The gate trench portion may include a linear gate portion. The linear gate portion may extend in an extension direction of the gate runner. Each dummy trench portion may include a linear dummy portion. The linear dummy portion may extend in a direction orthogonal to the extension direction of the gate runner.

The gate trench portion may include a first linear gate portion and a second linear gate portion. The first linear gate portion may extend in an extension direction of the gate runner. The second linear gate portion may extend in a direction orthogonal to the extension direction of the gate runner. Each dummy trench portion may include a first linear dummy portion and a second linear dummy portion. The first linear dummy portion may extend in an extension direction of the gate runner. The second linear dummy portion may extend in a direction orthogonal to the extension direction of the gate runner.

The semiconductor device may further comprise contact portions. The contact portions may electrically connect the electrodes provided in the dummy trench portions to the emitter electrode. The contact portions may be provided at positions on top of the dummy trench portions that are not on top of the gate runner.

The gate trench portion and the dummy trench portions may have a region where a closest distance therebetween is greater than or equal to a thickness of the trench insulating film and less than or equal to a width of the gate trench portion in a short direction.

The gate trench portion may be provided with a ring shape relative to the front surface of the semiconductor substrate.

The gate trench portion and the dummy trench portions may be provided in an alternating manner in a direction orthogonal to an extension direction of the gate runner.

The semiconductor device may further comprise a ring-shaped impurity injection region. The ring-shaped impurity injection region may have a ring shape relative to the front surface of the semiconductor substrate and surround the ring-shaped gate trench portion. A plurality of the impurity injection regions that are adjacent in a direction orthogonal to an extension direction of the gate runner may be provided in a manner to be shifted by a half pitch in the extension direction of the gate runner. The gate runner may be electrically connected to the electrode provided within the gate trench portion.

The summary clause does not necessarily describe all necessary features of the embodiments of the present invention. The present invention may also be a sub-combination of the features described above.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
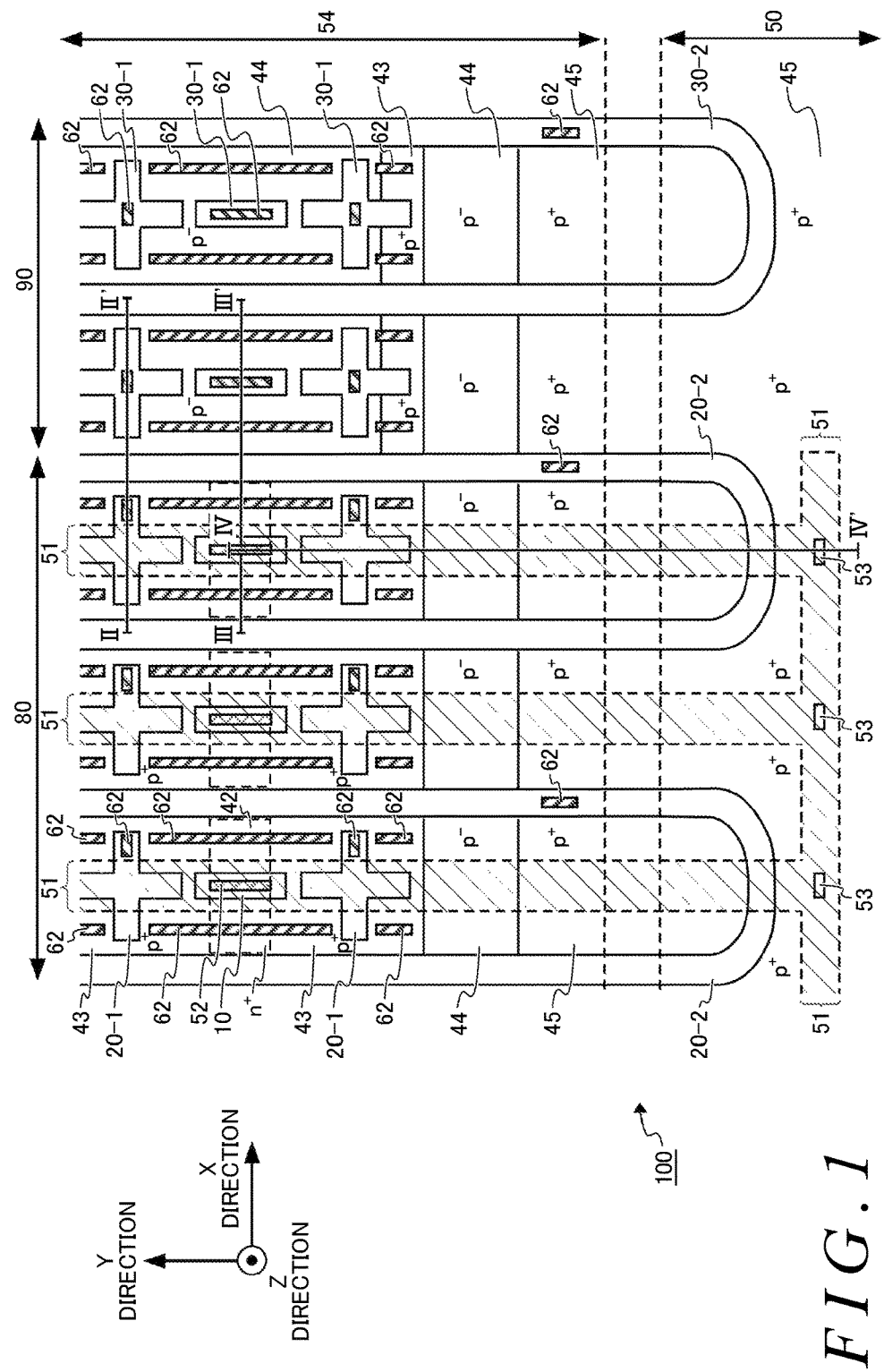
FIG. 1 is a schematic planar view of a top surface of a semiconductor device 100 according to a first embodiment.

FIG. 1 is a schematic planar view of a top surface of a semiconductor device 100 according to a first embodiment. The semiconductor device 100 of this example is a semiconductor substrate that includes a transistor portion 80 having a transistor such as an IGBT (Insulated Gate Bipolar Transistor) and a diode portion 90 having a diode such as an FWD (Free Wheel Diode). In this example, an IGBT is included in the transistor portion 80. Furthermore, in this example, the IGBT and FWD are formed integrally to create an RC-IGBT (Reverse-Conducting IGBT).

FIG. 1 shows an active region near an end portion of the semiconductor substrate, and does not show other regions. It should be noted that the semiconductor device 100 may have an edge termination portion that surrounds the active region in a planar view. The active region refers to a region in which current flows when the semiconductor device 100 is in the ON state. In contrast to this, the edge termination portion has a function of weakening the crowding of the electrical field on the front surface side of the semiconductor substrate. The edge termination portion may be a guard ring, a field plate, a RESURF, or a structure formed by combining two or more of these components, for example.

The semiconductor device 100 of this example includes a gate trench portion 10, a dummy trench portion 20, an emitter trench portion 30, an $n^+$-type emitter region 42, a $p^+$-type contact region 43, a $p^-$-type base region 44, and a $p^+$-type well region 45 in the front surface side of the semiconductor substrate, and includes a gate electrode 50, a gate runner 51, and an emitter electrode 54 on the front surface of the semiconductor substrate. An interlayer insulating film is provided between the gate electrode 50 and emitter electrode 54 and the front surface of the semiconductor substrate, but this interlayer insulating film is not shown in the drawing. The semiconductor device 100 includes a runner contact portion 52, a runner contact portion 53, and an emitter contact portion 62 that penetrate through the interlayer insulating film on the front surface side of the semiconductor substrate.

In this example, n and p respectively refer to a state in which electrons are the majority carrier and a state in which holes are the majority carrier. The + and − signs written to the upper right of n and p respectively mean that the carrier concentration is higher than in a case where a + sign is not written and that the carrier concentration is lower than in a case where a − sign is not written.

A trench portion and an impurity region are provided in the front surface side of the semiconductor substrate. Specifically, the gate trench portion 10, the dummy trench portion 20, the emitter trench portion 30, the $n^+$-type emitter region 42, the $p^+$-type contact region 43, the $p^-$-type base region 44, and the $p^+$-type well region 45 are formed inside the semiconductor substrate on the front surface side. In contrast, the gate electrode 50, the gate runner 51, the runner contact portion 52, the runner contact portion 53, the emitter electrode 54, and the emitter contact portion 62 are provided above the front surface of the semiconductor substrate.

The $n^+$-type emitter region 42 is described as straddling the gate trench portion 10, but this is merely a suitable description in consideration of the drawings, and it should be noted that the $n^+$-type emitter region 42 is not provided in the gate trench portion 10. This is also true for the second to eighth embodiments.

In this example, the X direction and Y direction are perpendicular to each other. In other words, the X direction and Y direction are directions that are independent from each other. The Z direction is perpendicular to the X-Y plane. The X direction, the Y direction, and the Z direction form a so-called right hand system. In this example, "up," "above," and the like indicate the +Z direction, and "down," "below," and the like indicate the −Z direction. The Y direction is the longitudinal direction of the gate runner 51.

The gate electrode 50 and the emitter electrode 54 are formed of a material containing metal. For example, at least a partial region of each electrode is formed of aluminum or an alloy containing aluminum. Each electrode may have a region formed of a material containing tungsten. A gate potential is applied to the gate electrode 50 from a gate terminal. An emitter potential is applied to the emitter electrode 54 from an emitter terminal. The emitter electrode 54 is formed at distance from the gate electrode 50.

The gate trench portion 10 and the dummy trench portion 20 are provided in the diode portion 90. The gate trench portion 10 and the dummy trench portion 20 may be formed to have predetermined shapes. The gate trench portion 10 of this example has a linear portion extending in the Y direction that serves as a linear gate portion. The dummy trench portion 20 includes a cross-shaped dummy trench portion 20-1 and a U-shaped dummy trench portion 20-2.

In this example, a hyphen and the numeral 1 are appended to a dot-shaped dummy trench portion 20 to label this dummy trench portion as "20-1." Furthermore, a hyphen and the numeral 2 are appended to a dummy trench portion 20 that is provided over a longer distance than the dot shape, such as seen in the long portion of the U shape, to label this dummy trench portion as "20-2." The term "dummy trench portions 20" is used to collectively refer to the dummy trench portion 20-1 and the dummy trench portion 20-2. The emitter trench portions 30 are labeled in the same way, such that the dot-shaped emitter trench portion 30 is labeled as "30-1" and the emitter trench portion 30 provided over a longer distance than the dot shape, such as the long portion of the U shape, is labeled as "30-2." The term "emitter trench portions 30" is used to collectively refer to the emitter trench portion 30-1 and the emitter trench portion 30-2.

The cross-shaped dummy trench portion 20-1 has a linear portion that extends in the Y direction serving as a first linear dummy portion and a linear portion extending in the X direction serving as a second linear dummy portion. In the cross-shaped dummy trench portion 20-1, the first linear dummy portion and the second linear dummy portion intersect with each other. The U-shaped dummy trench portion 20-2 has long portions that extend in the Y direction below the emitter electrode 54 and a short portion that extends in the X direction below the gate electrode 50.

In one example, the Y-direction length of the gate trench portion 10 is approximately 5 μm and the trench width, i.e. the X-direction length, is approximately 1.2 μm. In other words, the gate trench portion 10 of this example can be treated as being dot-shaped. The shape of the gate trench portion 10 in this example is extremely small compared to a conventional gate trench that extends over a long distance inside a semiconductor substrate. If the trench is to extend over a long distance, the trench extends approximately 5 μm to 50 μm, for example.

As an example, the trench width of the dummy trench portions 20 is approximately 1.2 μm. Also as an example, the lengths of the linear portions of the dummy trench portion 20-1 in the X direction and in the Y direction are each approximately 5 μm. The trench width and the length of each trench may be suitably adjusted according to characteristics such as the withstand voltage of certain elements and threshold values. The shape of the dummy trench portion 20-1 in this example can be treated as being a dot shape that is extremely small compared to a conventional gate trench.

A plurality of the gate trench portions 10 and a plurality of the dummy trench portions 20 may be arranged at prescribed intervals along a prescribed arrangement direction in a region of the transistor portion 80. In this example, gate trench portions 10 and cross-shaped dummy trench portions 20-1 are provided in an alternating manner in the Y direction. As an example, the gate trench portions 10 and the dummy trench portions 20-1 of this example are provided along the Y direction such that the shortest distance therebetween is less than 1 μm. Furthermore, as an example, a plurality of dummy trench portions 20-2 are provided such that the period of the linear portions in the X direction is approximately 4 μm. The gate trench portions 10 and the cross-shaped dummy trench portions 20-1 are provided periodically in the X direction, and this period is the same as that of the dummy trench portions 20-2.

The emitter trench portion 30 is provided in a region of the diode portion 90. The emitter trench portion 30 may have the same shape as the gate trench portions 10 and the dummy trench portions 20. In the diode portion 90, the pn junction between the type base region 44 and the n-type drift layer provided below this $p^-$-type base region 44 functions as a diode. Therefore, the emitter trench portion 30 need not have an active function, but has an effect of equalizing the potential distribution across the entire transistor portion 80 and diode portion 90 as a result of having the same shape as the gate trench portions 10 and the dummy trench portions 20. Furthermore, the emitter trench portion 30 has an effect of making the temperature generation uniform across the entire transistor portion 80 and diode portion 90.

The gate trench portions 10, some of the dummy trench portions 20, a portion of the emitter trench portion 30, the $n^+$-type emitter region 42, the $p^+$-type contact region 43, the $p^-$-type base region 44, and a portion of the $p^+$-type well region 45 are formed in a region directly below the emitter electrode 54. The $p^+$-type well region 45 is formed in a prescribed range from the Y-direction end of the semiconductor substrate on which the gate electrode 50 is provided. A partial region of the dummy trench portion 20-2 and the emitter trench portion 30, which is formed on the gate electrode 50 side, is formed in the $p^+$-type well region 45.

The $p^-$-type base region 44 is provided in each region sandwiched by respective trench portions. In the transistor portion 80, almost all of the $p^-$-type base region 44 is positioned under the $n^+$-type emitter region 42 and the $p^+$-type contact region 43. Therefore, in the transistor portion 80, the $p^-$-type base region 44 is exposed in the front surface of the semiconductor substrate only at a position adjacent to the $p^+$-type well region 45 in the Y direction. In the diode portion 90, the $p^-$-type base region 44 is exposed in the front surface of the semiconductor substrate, in addition to the $p^+$-type contact region 43 and the $p^+$-type well region 45. In this way, when the diode portion 90 of the RC-IGBT performs a reverse recovery operation, an effect of preventing an increase in the reverse recovery peak current is realized.

In the transistor portion 80, the $n^+$-type emitter region 42 and the $p^+$-type contact region 43 are each provided between two dummy trench portions 20-2 that are adjacent in the X direction, from the long portion of one of these dummy trench portions 20-2 to the long portion of the other dummy trench portion 20-2. Furthermore, a plurality of the $n^+$-type emitter regions 42 and $p^+$-type contact regions 43 are provided in an alternating manner in the Y direction. The $n^+$-type emitter regions 42 are provided in a manner to sandwich the gate trench portions 10 in the X direction and contact the gate trench portions 10.

The emitter contact portion 62 is an opening in the interlayer insulating film for electrically connecting the emitter electrode 54 and the front surface of the semiconductor substrate. A plurality of the emitter contact portions 62 are provided below the emitter electrode 54, in the transistor portion 80 and the diode portion 90.

In the transistor portion 80, the emitter contact portions 62 are provided to sandwich a gate trench portion 10 and the Y-direction linear portion of a dummy trench portion 20-1 in the X direction. The emitter contact portions 62 are provided on top of the X-direction ends of the X-direction linear portions of the dummy trench portions 20-1 and also on portions of the long portions of the dummy trench portions 20-2. In this way, an emitter potential is applied from the emitter electrode 54 to the trench electrodes provided within the dummy trench portions 20.

In the diode portion 90, the emitter contact portions 62 sandwich a linear emitter trench portion 30-1 and a cross-shaped emitter trench portion 30-1 in the X direction. The emitter contact portions 62 are also provided for the linear emitter trench portion 30-1, a central portion of the cross-shaped emitter trench portion 30-1, and a portion of the long portions of the U-shaped emitter trench portion 30-2. In this way, the emitter potential is applied to the trench electrode of the emitter trench portion 30.

On the front surface side of the semiconductor substrate, each gate trench portion 10 is surrounded by two or more dummy trench portions 20 from among the plurality of dummy trench portions 20. Having the gate trench portion 10 surrounded by dummy trench portions 20 may mean that the gate trench portion 10 is surrounded by a mesa region of the semiconductor substrate formed by the dummy trench portions 20. In this example, the gate trench portion 10 is sandwiched by two dummy trench portions 20-1 in the Y direction and also sandwiched by the two opposing long portions of a dummy trench portion 20-2 in the X direction.

At least a portion of the gate runner 51 is provided below the emitter electrode 54. The gate runner 51 has a region directly below the emitter electrode 54 and a region extending outside from the region directly below the emitter electrode 54. The gate runner 51 of this example has a region extending in the Y direction directly below the emitter electrode 54 and a region connecting, in the X direction, to this extending region directly below the gate electrode 50. The gate runner 51 may be metal wiring or wiring including polysilicon.

The gate runner 51 extends directly above the Y-direction linear portion of the gate trench portion 10. The trench electrode provided within the gate trench portion 10 is electrically connected to the gate runner 51 via the runner contact portion 52. The gate runner 51 is electrically connected to the gate electrode 50 via the runner contact portion 53. In this way, a gate potential from the gate electrode 50 is applied to the trench electrode provided within the gate trench portion 10. In this example, all of the gate trench portions 10 are provided in a region directly below the emitter electrode 54. Instead, some of the gate trench portions 10 may be provided in a region directly below the emitter electrode 54, and other gate trench portions 10 may be provided outside the region directly below the emitter electrode 54.

In the gate trench portion 10, a gate-emitter capacitance $C_{GE}$ is formed between the trench electrode having the gate potential and the emitter electrode 54. The gate-emitter capacitance $C_{GE}$ depends on the size of the gate trench portion 10. The size of the gate trench portion 10 refers to the lengths of the gate trench portion 10 in the X direction, Y direction, and Z direction.

When the gate is ON, a potential $V_{GE}$ is applied to the trench electrode of the gate trench portion 10, and the charge $Q_g$ is provided to the capacitance $C_{GE}$, thereby the capacitance $C_{GE}$ is charged. When the charge $Q_g$ reaches a prescribed value, the IGBT of the transistor portion 80 is turned ON. By having a drive circuit that is attached externally to the IGBT supply the charge $Q_g$ to the gate electrode 50 of the IGBT, the IGBT is driven and a drive current flows from the collector electrode to the emitter electrode 54. Therefore, it is necessary to provide a gate-emitter capacitance $C_{GE}$ that is suitable for the performance of the drive circuit. In particular, when used in an automobile, there are assumed to be cases demanding that the gate-emitter capacitance $C_{GE}$ be changed to a value suitable for the performance of the drive circuit without changing the drive current of the IGBT.

Conventionally, the gate trench portion extends over a long distance in the semiconductor substrate and does not have a dot shape. One reason for extending over a long distance is that the gate trench portion and the gate electrode 50 are electrically connected by having the gate trench portion extend to the position where the gate electrode 50 is provided. In such a case, the minimum necessary length of the gate trench portion is determined in advance, and therefore it is impossible to further reduce the length of the gate trench portion. In other words, it is impossible to reduce the total sum of the gate-emitter capacitance $C_{GE}$. Specifically, it is impossible to provide a circuit for which the gate-emitter capacitance $C_{GE}$ has been adjusted according to the performance of the drive circuit.

In contrast, in the present example, each gate trench portion 10 is formed with a dot shape of several micrometers and does not extend over a long distance from one end of the transistor portion 80 to the other end. Furthermore, the dot-shaped gate trench portions 10 and dummy trench portions 20-1 are arranged periodically in the X direction and the Y direction. In this example, it is possible to adjust the total sum of the gate-emitter capacitance $C_{GE}$ of the semiconductor device 100 simply by changing the surface area ratio of the gate trench portions 10 relative to the dummy trench portions 20 in a planar view. In other words, it is possible to reduce and increase the total sum of the gate-emitter capacitance $C_{GE}$. In this way, it is possible to flexibly adjust the gate-emitter capacitance $C_{GE}$ according to the performance of the drive circuit.

For example, a gate trench portion 10 can be prevented from functioning as a gate by not being provided with the runner contact portion 52. In this way, the surface area ratio of the gate trench portions 10 relative to the surface area ratio of the dummy trench portions 20 is reduced, and therefore it is possible to reduce the gate-emitter capacitance $C_{GE}$. Furthermore, by providing the runner contact portion 52 on top of a dummy trench portion 20-1 instead of providing the emitter contact portion 62 on this dummy trench portion 20-1, it is possible to change this dummy trench portion 20-1 into a gate trench portion 10. In this way, the surface area ratio of the gate trench portions 10 relative to the surface area ratio of the dummy trench portions 20 is increased, and therefore it is possible to increase the gate-emitter capacitance $C_{GE}$.

In addition, in this example, the dummy trench portions 20 are provided in a manner to surround each dot-shaped gate trench portion 10 in the X direction and the Y direction. In this way, compared to a case where the gate trench portions 10 extend over a long distance, it is possible to improve the carrier density of the carriers, i.e. electrons and holes, accumulated in the drift region while the gate electrode is in the ON state. In other words, the carrier accumulation effect can be realized. As a result, compared to a case where the gate trench portions 10 extend over a long distance, the ON voltage (Von) can be reduced.

Figure 2:
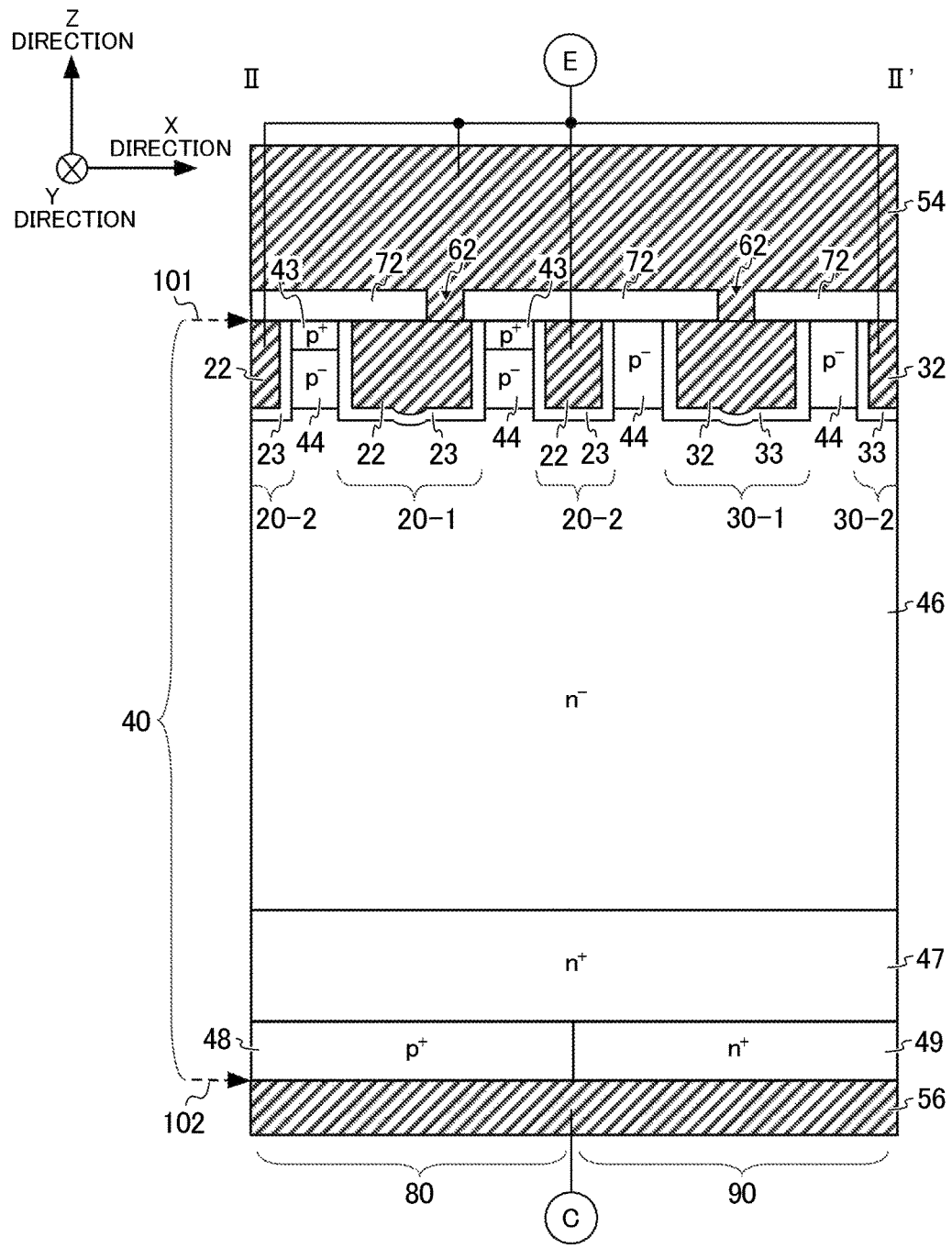
FIG. 2 shows the II-II' cross section of FIG. 1.

FIG. 2 shows the II-II' cross section of FIG. 1. FIG. 2 shows a cross section obtained by cleaving the semiconductor device 100 in a plane parallel to the X-Z plane, in a manner to pass through a dummy trench portion 20-1 of the transistor portion 80 and a cross-shaped dummy trench portion 20-2 of the diode portion 90.

As shown in FIG. 2, the semiconductor device 100 includes an emitter electrode 54 on the front surface 101 of the semiconductor substrate 40 and a collector electrode 56 below the back surface 102. The emitter terminal is schematically shown by an encircled E and the collector terminal is schematically shown by an encircled C. The emitter terminal is electrically connected to the emitter electrode 54. The collector terminal is electrically connected to the collector electrode 56.

The semiconductor substrate 40 includes a $p^+$-type collector layer 48 and an $n^+$-type cathode layer 49 on the back surface 102 side. The $p^+$-type collector layer 48 is provided on the back surface 102 side of the transistor portion 80, and the $n^+$-type cathode layer 49 is provided on the back surface 102 side of the diode portion 90. The semiconductor substrate 40 includes the $p^+$-type collector layer 48 and the $n^+$-type cathode layer 49, an $n^+$-type buffer layer 47, an $n^-$-type drift layer 46, the $p^-$-type base region 44, and the $p^+$-type contact region 43 in the stated order from the back surface 102 to the front surface 101 thereof.

The semiconductor device 100 includes a first interlayer insulating film 72 on top of the front surface 101. The first interlayer insulating film 72 is provided between the front surface 101 of the semiconductor substrate 40 and the emitter electrode 54. The first interlayer insulating film 72 is provided with emitter contact portions 62. The trench electrode 22 of the dummy trench portion 20-1 and the trench electrode 32 of the emitter trench portion 30 are directly connected to the emitter electrode 54 through the emitter contact portions 62.

Each dummy trench portion 20 includes a trench electrode 22 and a trench insulating film 23. The trench insulating film 23 is an insulating film formed in contact with the side walls and bottom portion of the dummy trench portion 20. The trench insulating film 23 is formed of silicon oxide, for example. The trench electrode 22 is an electrode provided within the dummy trench portion 20 in contact with the trench insulating film 23. The trench electrode 22 is formed of poly silicon, for example. The trench electrode 22 is electrically connected to the emitter electrode 54 via an emitter contact portion 62. Similarly, each emitter trench portion 30 includes a trench electrode 32 and a trench insulating film 33. The trench electrode 32 is also electrically connected to the emitter electrode 54 via an emitter contact portion 62.

At a location in each cross-shaped dummy trench portion 20-1 where the X-direction trench and the Y-direction trench intersect, the etching rate is higher and the trench depth is greater than at locations where these trenches do not intersect. Therefore, compared to the bottom portion of a gate trench portion 10 that does not have an intersecting location, the electrical field strength at the bottom portion of the intersecting location of the dummy trench portion 20-1 can be higher than in the surrounding regions. As a result, it is possible to prevent an increase in the electrical field strength at the bottom portion of the gate trench portion 10.

Figure 3:
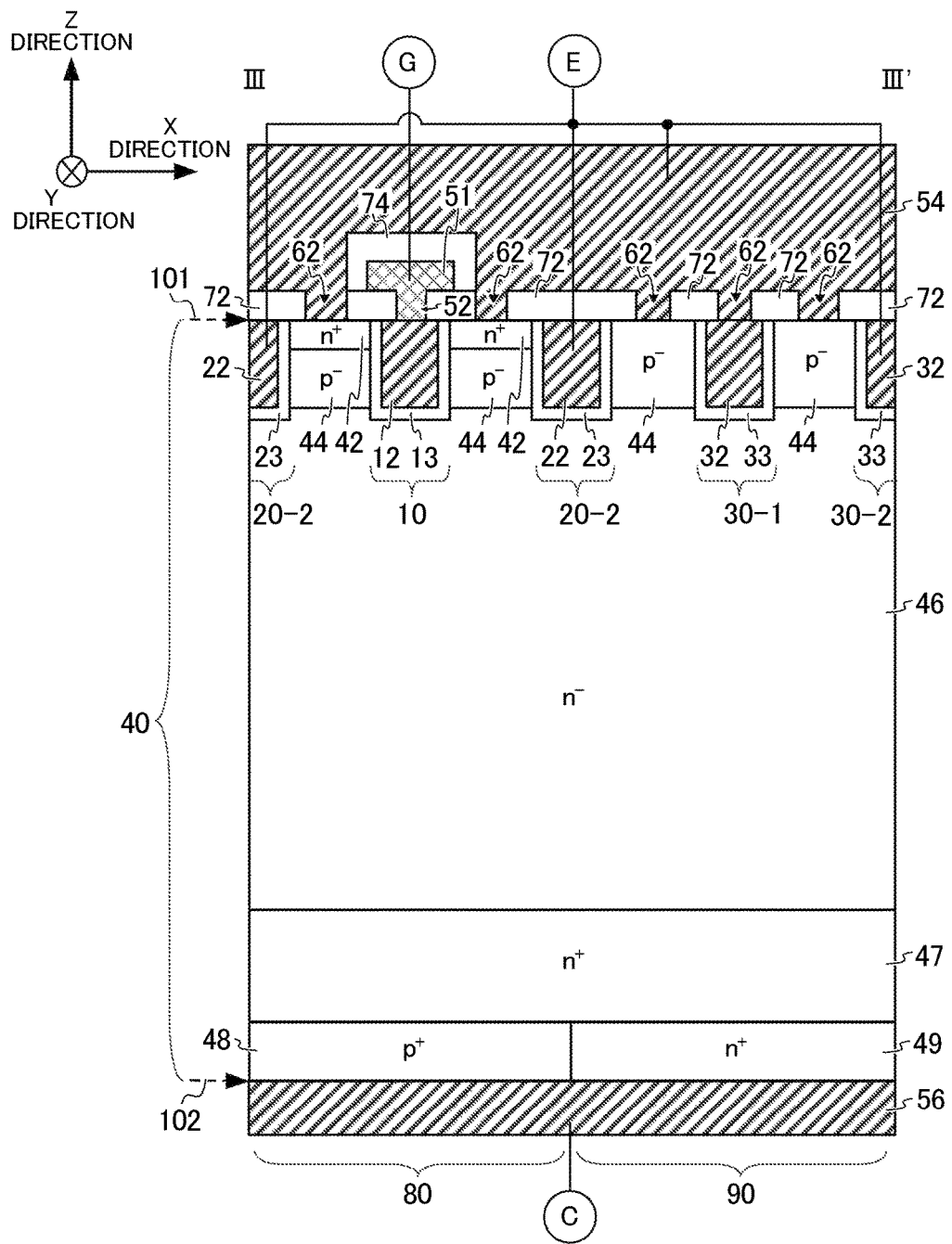
FIG. 3 shows the cross section of FIG. 1.

FIG. 3 shows the cross section of FIG. 1. FIG. 3 shows a cross section obtained by cleaving the semiconductor device 100 in a plane parallel to the X-Z plane, in a manner to pass through a gate trench portion 10 of the transistor portion 80 and an emitter trench portion 30 of a Y-direction linear portion of the diode portion 90.

The gate trench portion 10 includes a trench electrode 12 and a trench insulating film 13. The trench insulating film 13 is an insulating film formed in contact with the side walls and bottom portion of the gate trench portion 10, in the same manner as in the dummy trench portions 20. The trench insulating film 13 is formed of silicon oxide, for example. The trench electrode 12 is an electrode buried in the gate trench portion 10 in contact with the trench insulating film 13. The trench electrode 12 is formed of polysilicon, for example.

The first interlayer insulating film 72 on top of the gate trench portion 10 includes a runner contact portion 52. The gate runner 51 is electrically connected to the trench electrode 12 via the runner contact portion 52. A second interlayer insulating film 74 is provided on side portions and a top portion of the gate runner 51. The gate runner 51 is electrically insulated from the emitter electrode 54 by the second interlayer insulating film 74. The gate terminal is schematically shown by an encircled G. The gate terminal is electrically connected to the gate electrode 50.

Prescribed voltages are applied to the emitter electrode 54 and the collector electrode 56. For example, a positive bias that is higher than the potential of the emitter electrode 54 is applied to the collector electrode 56. A ground potential is applied to the emitter electrode 54, for example. When the prescribed voltage is applied to the gate electrode 50, a channel is formed in the p$^-$-type base region 44 near the side walls of the gate trench portion 10. At this time, conductivity modulation occurs in the n$^-$-type drift layer 46, and current flows from the collector electrode 56 to the emitter electrode 54.

In the dummy trench portion 20, the trench electrode 22 is electrically connected to the emitter electrode 54. The dummy trench portion 20 provides the semiconductor device 100 with a carrier injection enhancement effect (also referred to as an injection enhanced effect) in the n$^-$-type drift layer 46.

Figure 4:
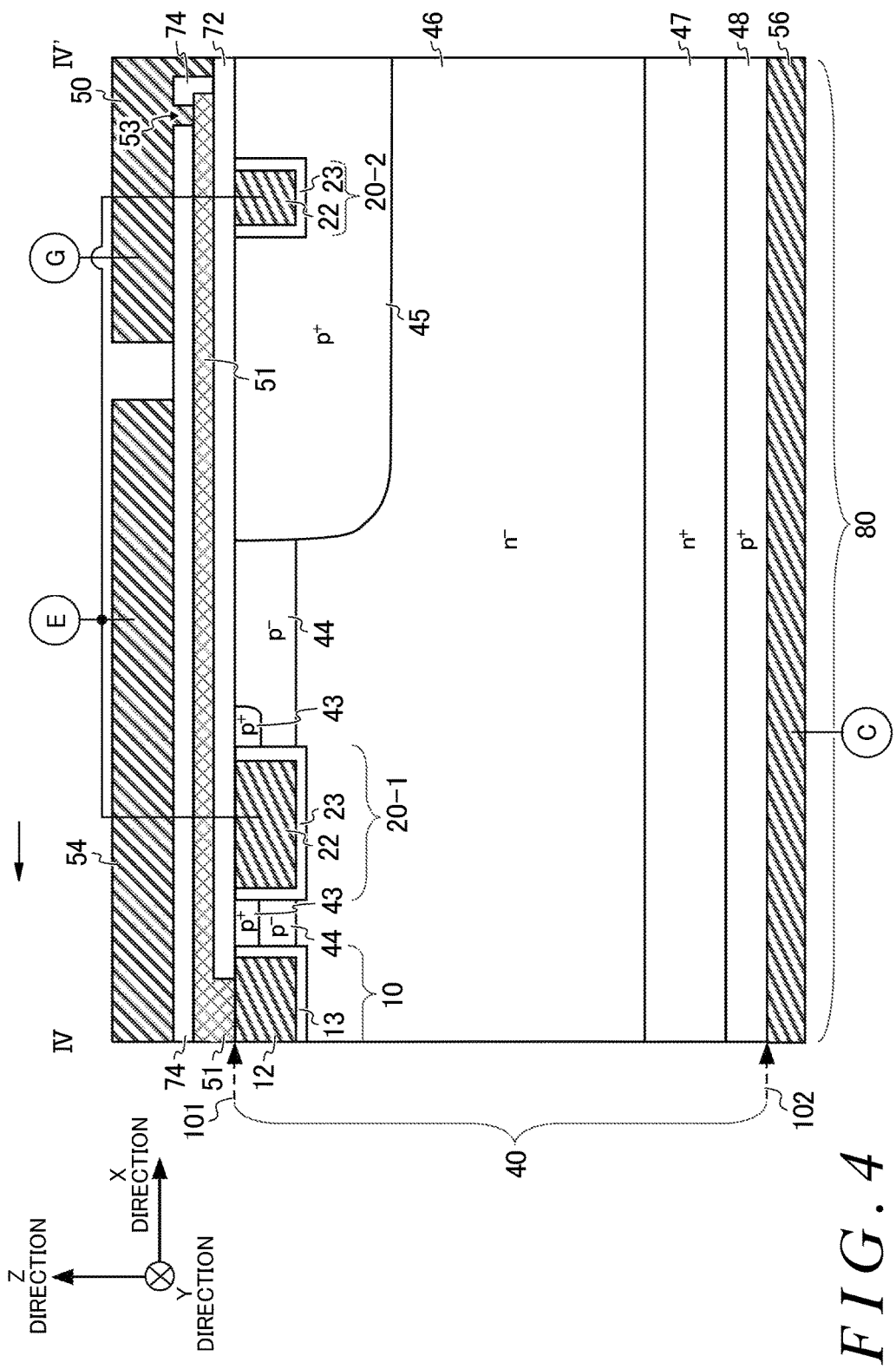
FIG. 4 shows the IV-IV' cross section of FIG. 1.

FIG. 4 shows the IV-IV' cross section of FIG. 1. FIG. 4 shows a cross section obtained by cleaving the semiconductor device 100 in a plane parallel to the X-Z plane, in a manner to pass through a gate trench portion 10 and a cross-shaped dummy trench portion 20-1 that are adjacent in the transistor portion 80.

The dummy trench portion 20-2 in FIG. 4 is a portion corresponding to the short portion of the U-shaped dummy trench portion 20-2 shown in FIG. 1. As shown in FIG. 4, the p$^+$-type well region 45 is formed at a deeper position than the dummy trench portion 20-2.

As shown in FIG. 4, the trench electrode 22 and the gate runner 51 are electrically separated from each other by the first interlayer insulating film 72 on top of the dummy trench portions 20. The gate runner 51 is electrically connected to the trench electrode 12 of the gate trench portion 10 by the runner contact portion 52 provided in the first interlayer insulating film 72. The gate runner 51 and the emitter electrode 54 are electrically separated from each other by the second interlayer insulating film 74 on top of the gate runner 51. The gate runner 51 is electrically connected to the gate electrode 50 via the runner contact portion 53 provided in the second interlayer insulating film 74.

(Exemplary Manufacturing Method)

The following describes an exemplary manufacturing method of the semiconductor device 100. It should be noted that the semiconductor device 100 manufacturing method is not limited to this example. Here, E indicates 10 raised to a certain power, e.g. 1 E+16 cm$^{-3}$ means 1×10$^{16}$ cm$^{-3}$.

First, the semiconductor substrate 40 having the same conductivity type as the n$^-$-type drift layer 46 is prepared. Next, an etching mask with a prescribed pattern is provided on the front surface of the semiconductor substrate 40, and the grooves of the gate trench portions 10, the dummy trench portions 20, and the emitter trench portions 30 are formed.

At this time, the mask aperture widths for forming each groove are the same. After forming the grooves, the trench insulating film 13, the trench insulating film 23, and the trench insulating film 33 are respectively formed on the inner walls of the grooves. The grooves are respectively filled with the trench electrodes 12, the trench electrodes 22, and the trench electrodes 32, to be in contact with the respective trench insulating films formed on the inner walls.

Next, p-type impurities are selectively injected from the front surface 101 side of the semiconductor substrate 40, and thermal processing is performed for approximately 2 hours at a temperature of approximately 1100° C. As a result, the p$^+$-type contact region 43, the p$^-$-type base region 44, and the p$^+$-type well region 45 are each formed in the entire front surface of the semiconductor substrate 40. The p-type impurities may be boron (B). The p-type impurity doping may be performed with an impurity concentration of 3 E+15 cm$^{-2}$ in the p$^+$-type contact region 43, an impurity concentration of 2.5 E+13 cm$^{-2}$ in the p$^-$-type base region 44, and an impurity concentration of 5.5 E+18 cm$^{-2}$ in the p$^+$-type well region.

Next, n-type impurities are selectively injected from the front surface 101 side of the semiconductor substrate 40. In this way, the n$^+$-type emitter region 42 is selectively formed.

The n-type impurities may be one or more of phosphorous (P) and arsenic (As). The n-type impurity doping may be performed with an impurity concentration of 5 E+19 cm$^{-2}$ in the n$^+$-type emitter region 42. After this, the first interlayer insulating film 72 is formed on the front surface 101 side of the semiconductor substrate 40, and the runner contact portions 52 and emitter contact portions 62 are provided in the first interlayer insulating film 72 through selective etching.

Next, the gate runner 51 is formed as a film and patterned. Furthermore, the second interlayer insulating film 74 is formed on top of the gate runner 51, and the runner contact portions 53 are provided in the second interlayer insulating film 74 through selective etching. Next, electrode material is formed as a film and patterned, thereby forming the gate electrode 50 and the emitter electrode 54.

Next, doping with n-type impurities is performed form the back surface 102 side of the semiconductor substrate 40 to form the n$^+$-type buffer layer 47. For example, ion injection may be performed a plurality of times using different dose amounts of protons, from the back surface 102 side with a concentration of approximately 1.0 E+14 cm$^{-2}$. Next, thermal processing is performed at a temperature of approximately 300° C. to 400° C., thereby forming VOH defects due to the hydrogen injected according to the proton injection and the oxygen and vacancies in the semiconductor substrate 40. These VOH defects serve as donors (hydrogen donors). These hydrogen donors become the n$^+$-type buffer layer 47.

Next, the region corresponding to the transistor portion 80 is doped with p-type impurities from the back surface 102 of the semiconductor substrate 40. In this way, the p$^+$-type collector layer 48 is formed to be thinner than the n$^+$-type buffer layer 47. For example, the p-type impurities are ion-injected from the back surface 102 side with a dose amount greater than or equal to 1.0 E+13 cm$^{-2}$ and less than or equal to 4.0 E+13 cm$^{-2}$. Furthermore, in order to form the n$^+$-type cathode layer 49, the region corresponding to the diode portion 90 is doped with n-type impurities from the back surface 102 of the semiconductor substrate 40. For example, the n-type impurities are ion-injected from the back surface 102 side with a dose amount greater than or equal to 1.0 E+14 cm$^{-2}$ and less than or equal to 1.0 E+16 cm$^{-2}$. After this, laser annealing is performed on the injection surface, and the p-type impurities and n-type impurities are activated. Finally, the collector electrode 56 is formed on the back surface 102 side.

Figure 5:
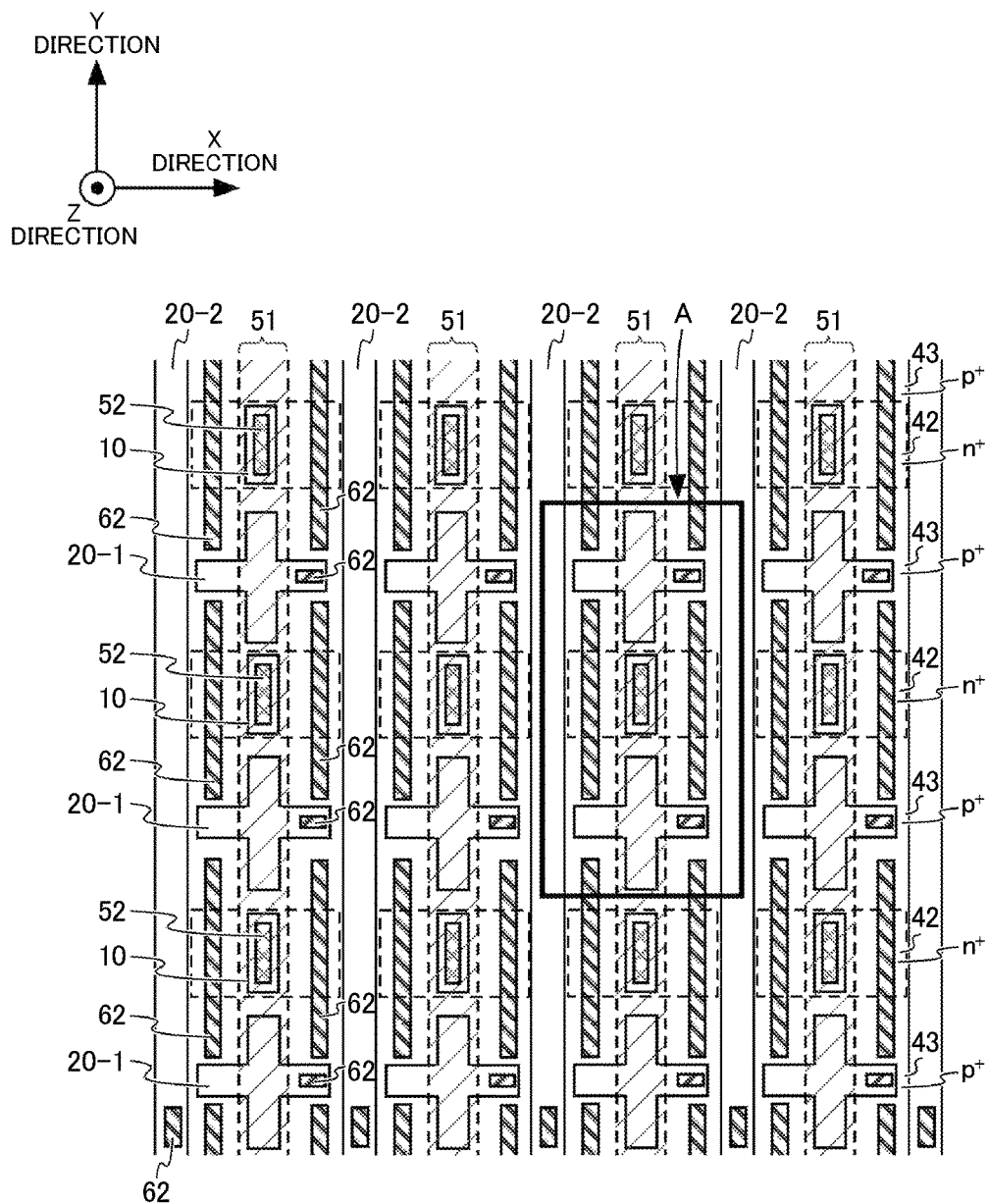
FIG. 5 is a schematic planar view of the transistor portion 80 according to the first embodiment.

FIG. 5 is a schematic planar view of the transistor portion 80 according to the first embodiment. A portion of FIG. 5 is labeled as region A, and an enlarged view of this region is described with reference to the following drawing.

Figure 6:
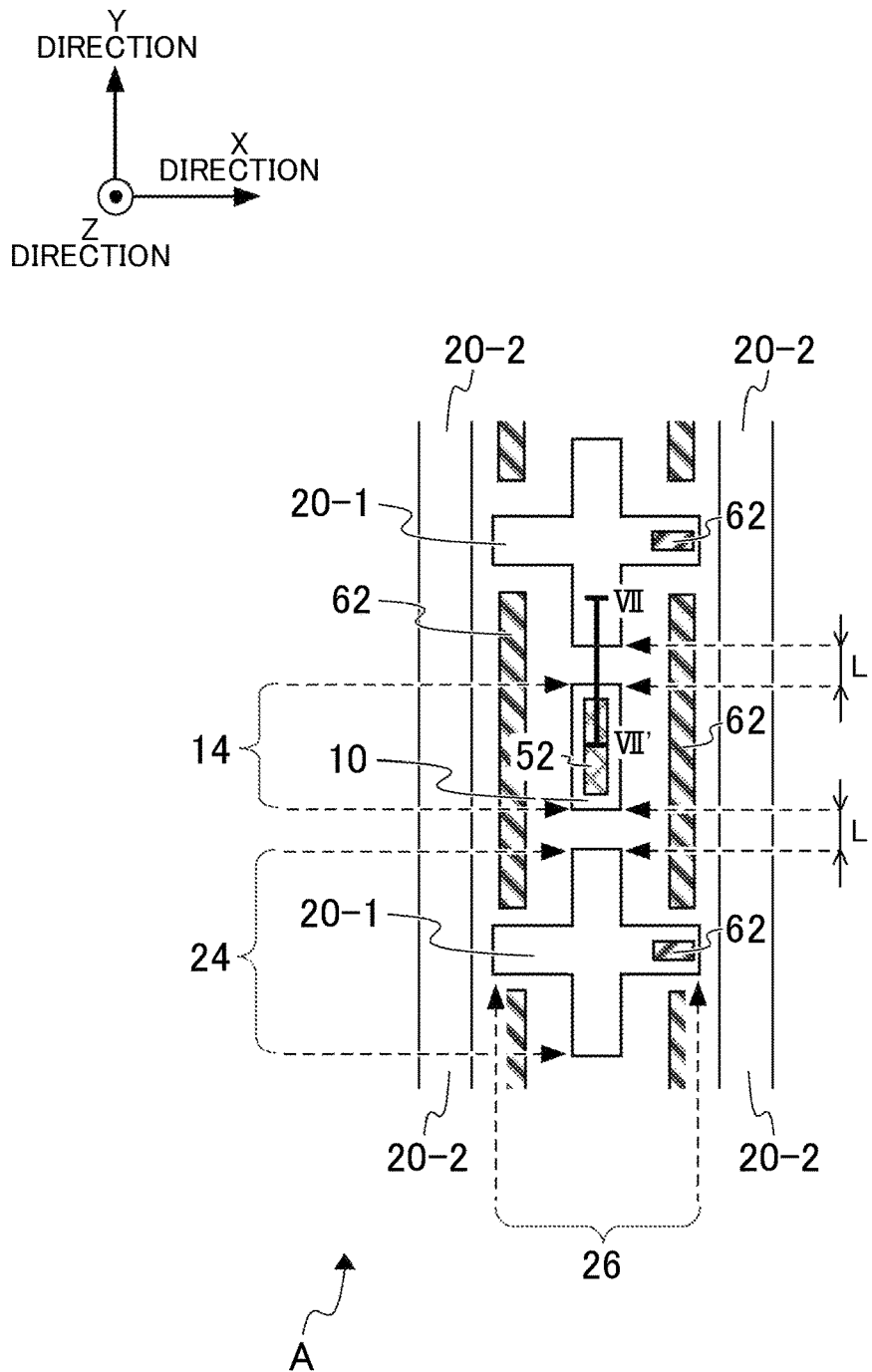
FIG. 6 is an enlarged view of the region A of the transistor portion 80 according to the first embodiment.

FIG. 6 is an enlarged view of the region A of the transistor portion 80 according to the first embodiment. The gate trench portion 10 has a first linear gate portion 14 extending in the Y direction. The dummy trench portion 20-1 has a first linear dummy portion 24 extending on the Y direction and a second linear dummy portion 26 extending in the X direction. The gate trench portion 10 and the dummy trench portion 20-1 that are adjacent to each other may have a region where the shortest distance L therebetween is 0.2 μm.

In this example, the shortest distance L is the distance between the −Y-direction end of the first linear gate portion 14 and the +Y-direction end of the first linear dummy portion 24, where the first linear gate portion 14 and the first linear dummy portion 24 are parallel to each other. It should be noted that the shortest distance L is not limited to the distance between two lines that are parallel to each other.

The shortest distance L may be the minimum distance between the first linear gate portion 14 and the first linear dummy portion 24. Here, 0.2 μm is the minimum distance that can be realized within a realistic cost range during mass production, in consideration of the variation accuracy for aligning the alignment matrix. For example, the shortest distance L may be less than or equal to the thickness of the trench insulating film 13. Instead, the shortest distance L may be greater than or equal to the thickness of the trench insulating film 13 and less than or equal to the width of the gate trench portion 10 in the short direction.

Figure 7:
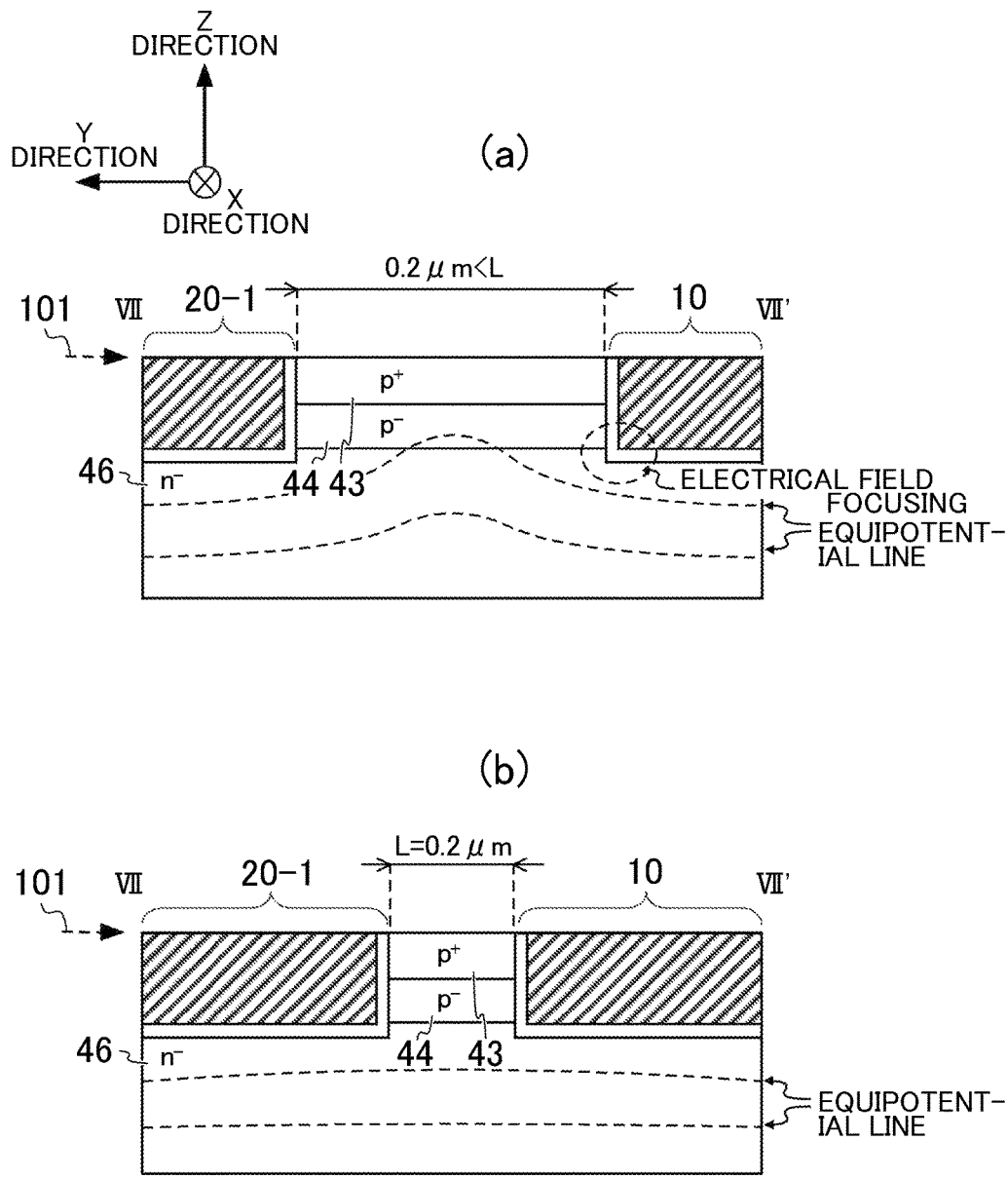
FIG. 7 is a drawing for describing the relationship between the potential distribution and the shortest distance L of the gate trench portion 10 and the dummy trench portion 20.

FIG. 7 is a drawing for describing the relationship between the potential distribution and the shortest distance L of the gate trench portion 10 and the dummy trench portion 20. FIG. 7 schematically shows the equipotential distribution near the front surface 101 when the IGBT is OFF. In FIG. 7, case (a) shows a case where the shortest distance L is greater than 0.2 μm. In FIG. 7, case (b) shows a case where the shortest distance is 0.2 μm, and this case corresponds to the first embodiment.

When the IGBT is OFF, a reverse bias is applied to the body diode of the IGBT, and the depletion layer expands between the n$^-$-type drift layer 46 and the p$^-$-type base region 44. As shown in case (a) of FIG. 7, when the gate trench portion 10 is distanced from the dummy trench portion 20-1, the depletion layer expands more easily than in case (b). Therefore, the equipotential line protrudes in the +Z direction, amd the electrical field becomes prone to focusing at the corners of the bottom portion of the gate trench portion 10. Accordingly, it is easier for insulation breakdown to occur in case (a) than in case (b) in FIG. 7.

In contrast, as shown in case (b) of FIG. 7, when the gate trench portion 10 is extremely close to the dummy trench portion 20-1, it is more difficult for the depletion layer to expand. Therefore, the equipotential distribution remains substantially flat. Accordingly, it is possible to prevent the current from being focused at the corners of the bottom portion of the gate trench portion 10. Preferably, the closest distance L may be less than the width of the built-in depletion layer that expands in the n$^-$-type drift layer 46 during a zero bias state when voltage is not applied between the emitter electrode 54 and the collector electrode 56.

Figure 8:
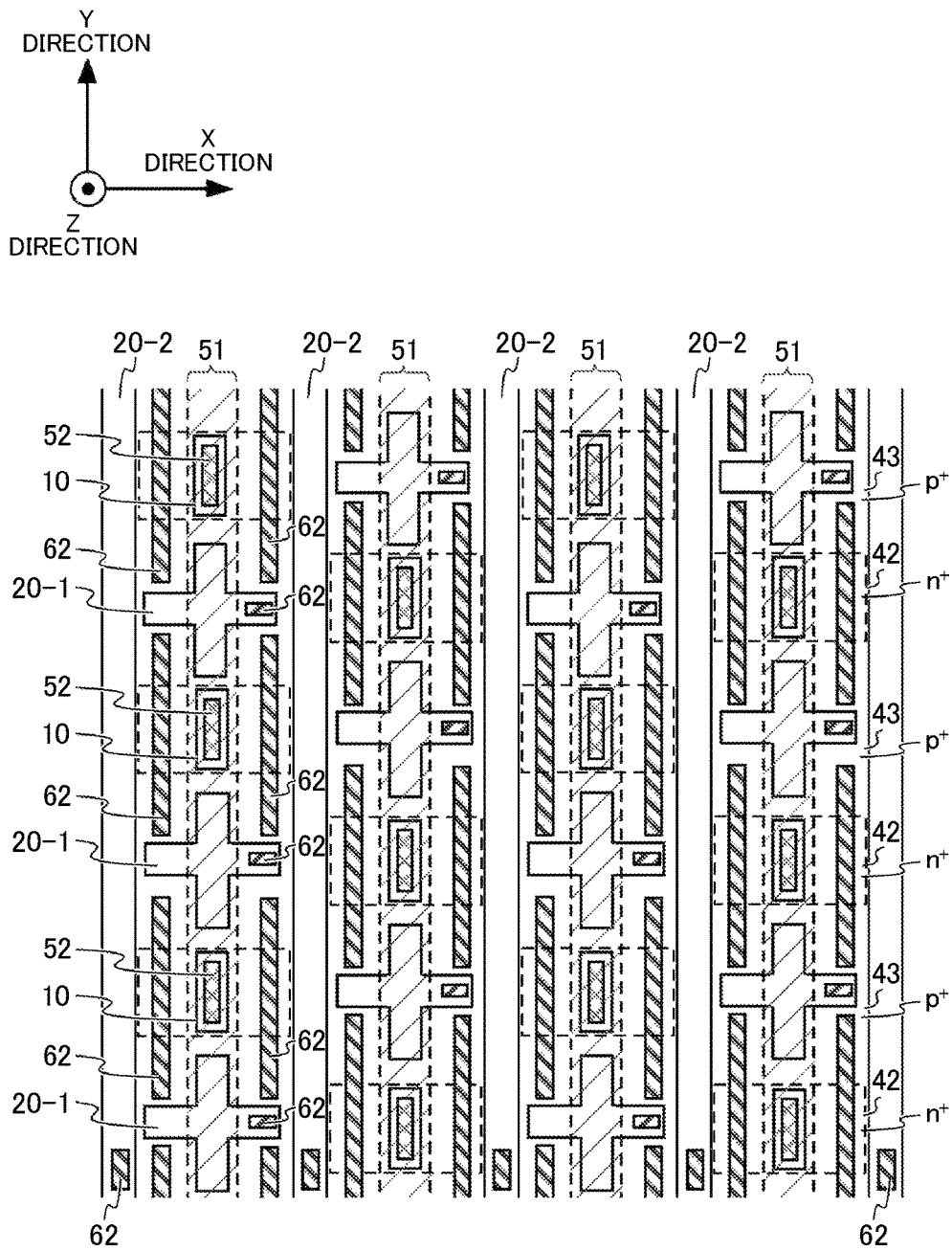
FIG. 8 is a schematic planar view of the transistor portion 80 according to the second embodiment.

FIG. 8 is a schematic planar view of a transistor portion 80 according to a second embodiment. In this example, the gate trench portions 10 and the dummy trench portions 20-1 are provided in an alternating manner in the X direction as well. The second embodiment differs from the first embodiment with regard to this point. With this example as well, it is possible to realize the same effect as the first embodiment.

Figure 9:
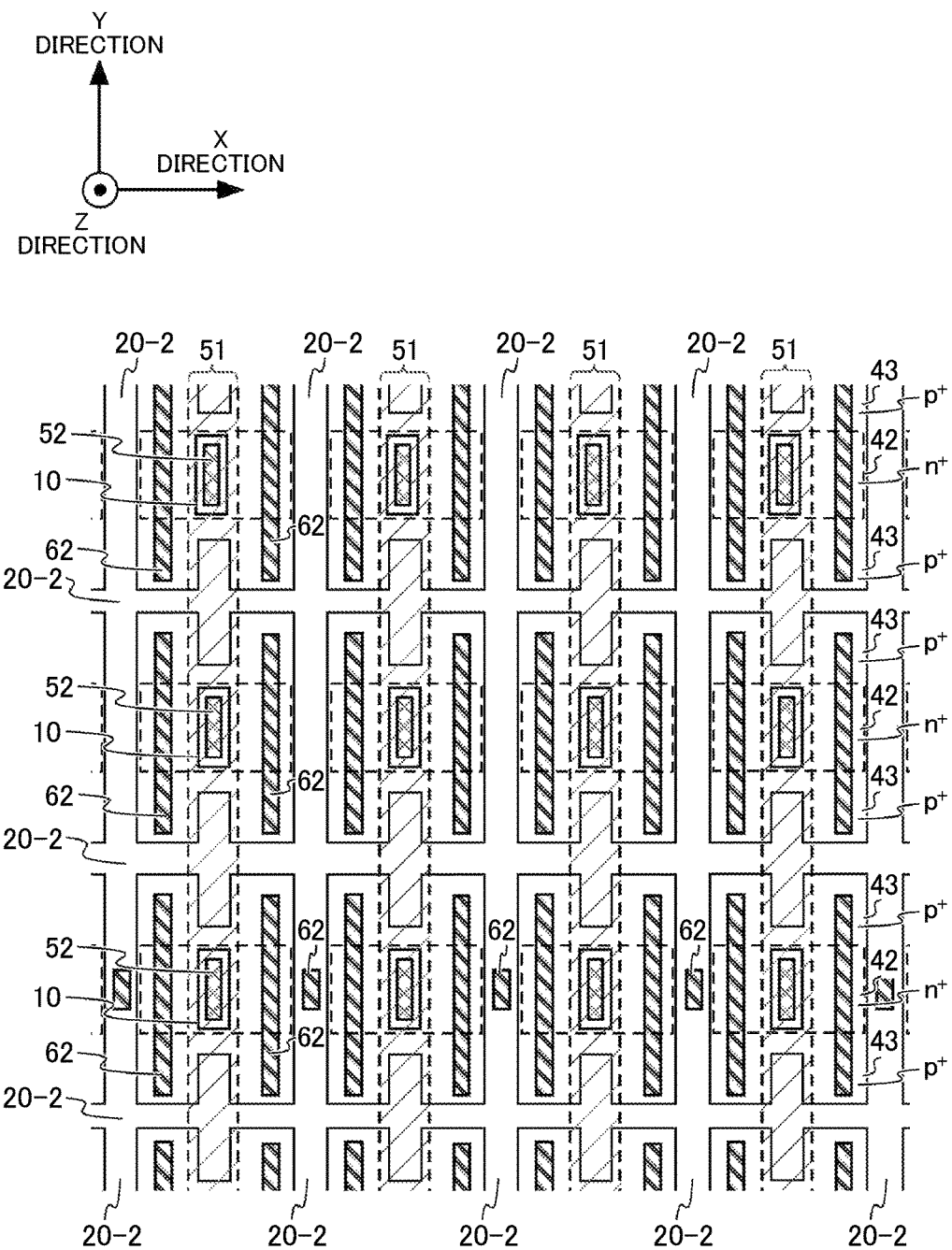
FIG. 9 is a schematic planar view of the transistor portion 80 according to the third embodiment.

FIG. 9 is a schematic planar view of a transistor portion 80 according to a third embodiment. This example has a structure in which the cross-shaped dummy trench portions 20-1 and the long portions of the U-shaped dummy trench portions 20-2 in the first embodiment are connected. In other words, this example has a structure in which the dummy trench portions 20-1 and the dummy trench portions 20-2 are all connected by having the second linear dummy portions 26 shown in FIG. 6 extend in the Y direction, thereby forming the dummy trench portion 20-2 of this example. As a result, the dot-shaped dummy trench portions 20-1 are not present in this example. The third embodiment differs from the first embodiment with regard to this point.

In this example, it is possible to remove the gate trench portion 10 by removing the runner contact portion 52. In this way, it is possible to reduce the surface area ratio of the gate trench portions 10 relative to the dummy trench portions 20.

Accordingly, the gate-emitter capacitance $C_{GE}$ can be adjusted according to the performance of the drive circuit.

Figure 10:
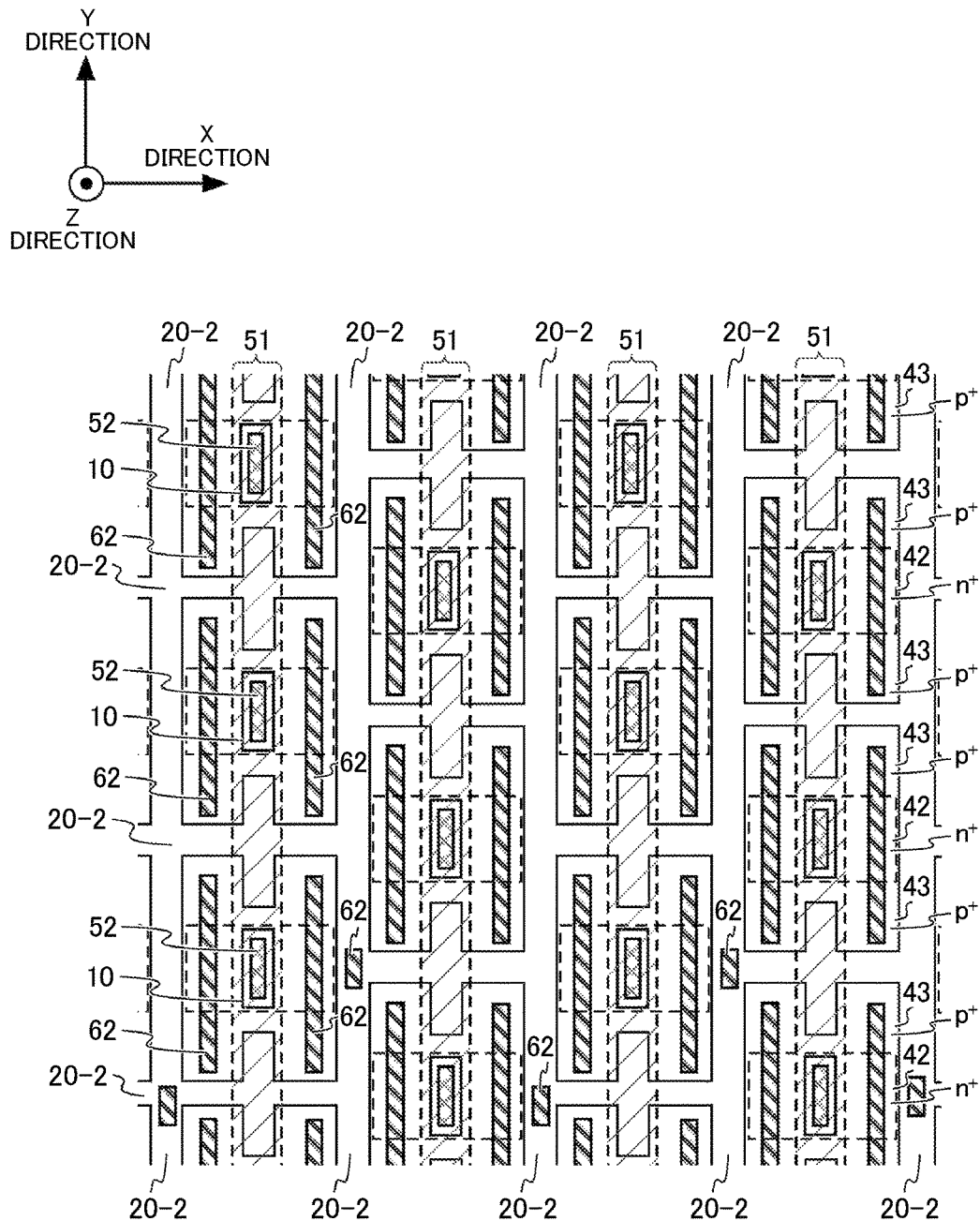
FIG. 10 is a schematic planar view of the transistor portion 80 according to the fourth embodiment.

FIG. 10 is a schematic planar view of a transistor portion 80 according to a fourth embodiment. This example has a structure in which every other gate trench portion 10 adjacent in the X direction is shifted in the Y direction by a half pitch, compared to the structure of the third embodiment. The fourth embodiment differs from the third embodiment with regard to this point. With this example as well, it is possible to realize the same effect as the third embodiment. In this example, 1 pitch is the interval between the center portions of two adjacent gate trench portions 10 among the plurality of gate trench portions 10 provided as columns in the Y direction.

Figure 11:
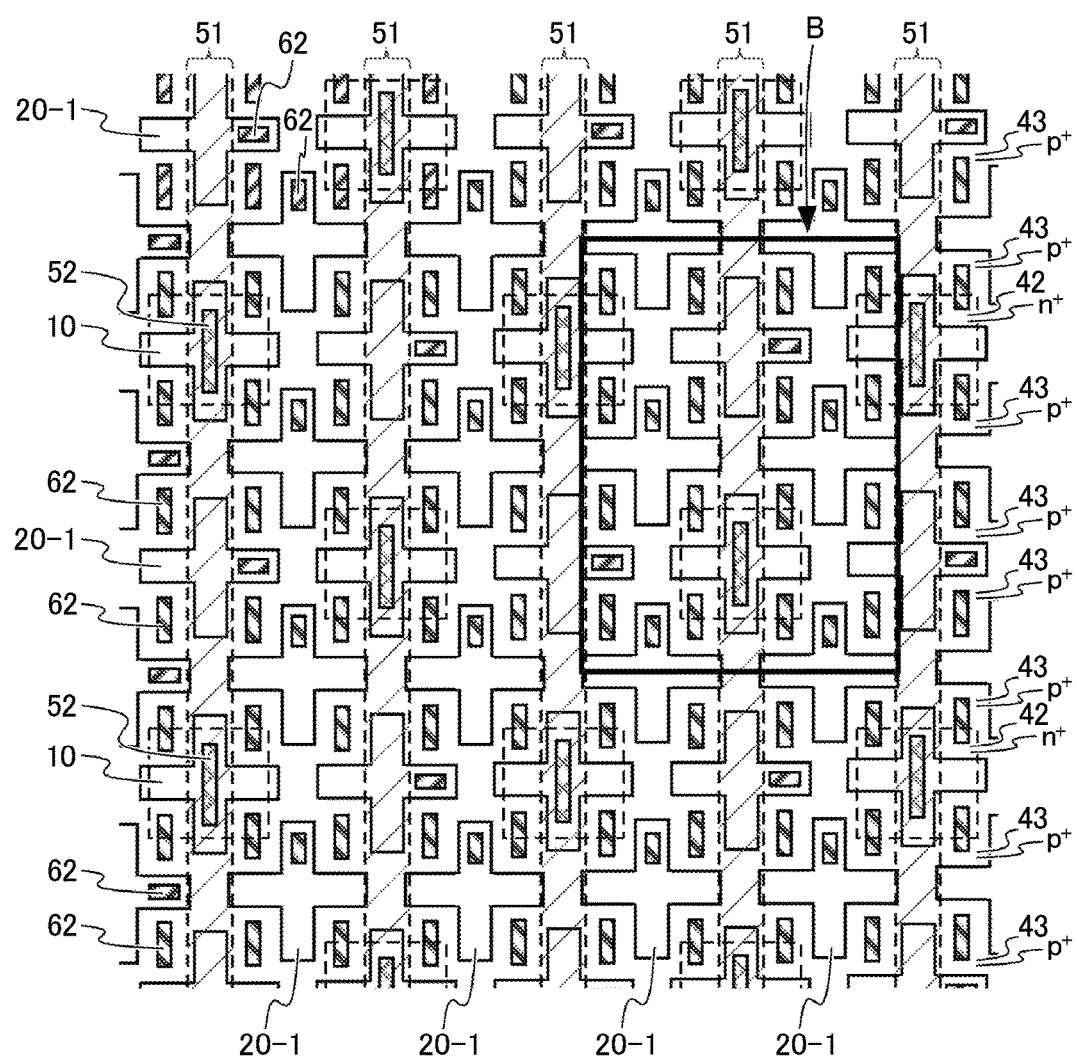
FIG. 11 is a schematic planar view of the transistor portion 80 according to the fifth embodiment.

FIG. 11 is a schematic planar view of a transistor portion 80 according to a fifth embodiment. This example has a structure in which the shapes of the gate trench portions 10 are changed from linear to dots having a cross shape. Furthermore, the long portions of the U-shaped dummy trench portions 20-2 in the first embodiment are divided into segments to form cross-shaped dummy trench portions 20-1. In accordance with this, two emitter contact portions 62 sandwiching a gate trench portion 10 in the X direction in the first embodiment are divided into segments in the Y direction. The fifth embodiment differs from the first embodiment with regard to this point.

Figure 12:
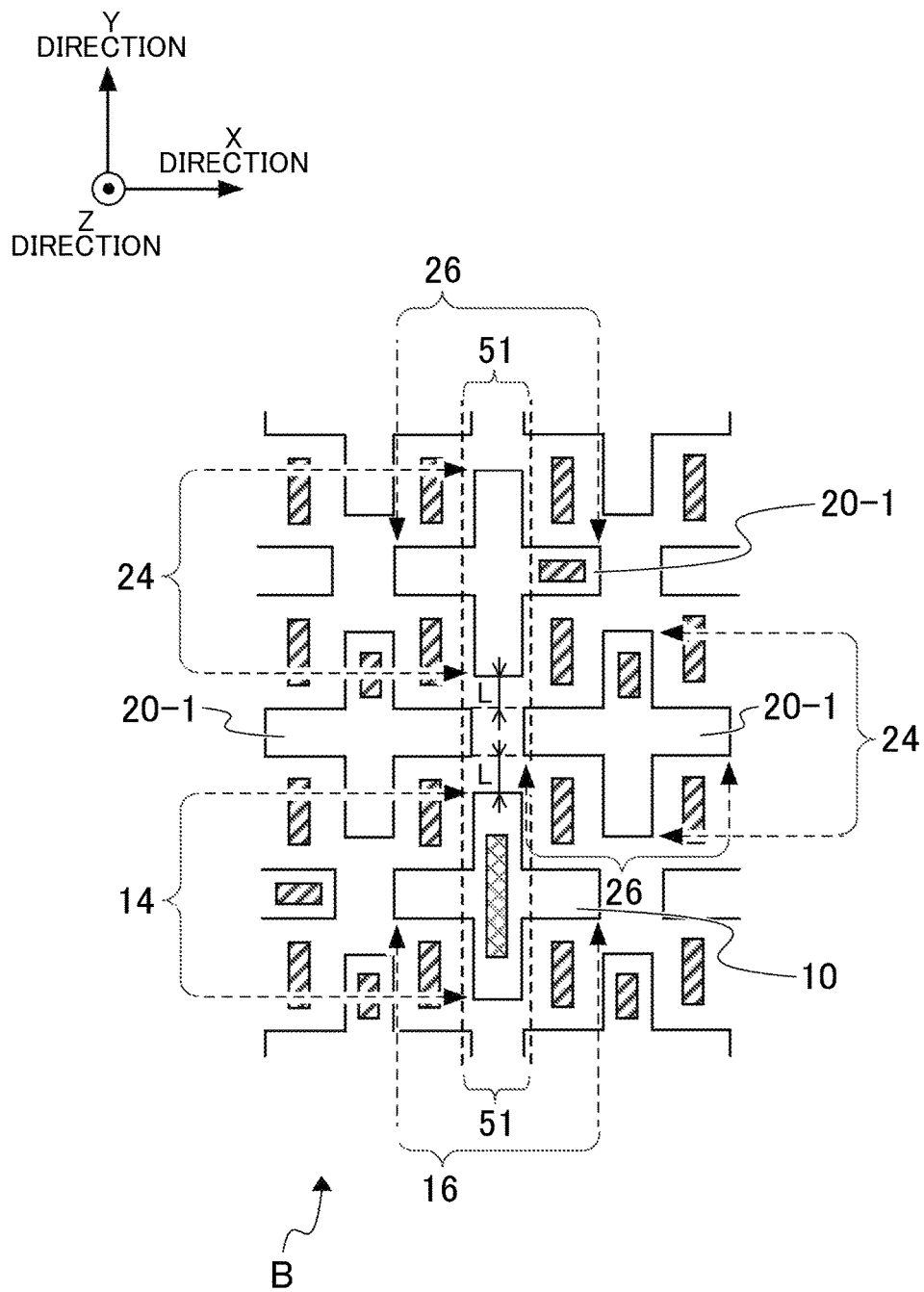
FIG. 12 is an enlarged view of the region B of the transistor portion 80 according to the fifth embodiment

FIG. 12 is an enlarged view of region B of the transistor portion 80 according to the fifth embodiment. Each gate trench portion 10 of this example includes a first linear gate portion 14 and a second linear gate portion 16. The first linear gate portion 14 and the second linear gate portion 16 intersect with each other. The first linear gate portion 14 extends in the Y direction, which is the extension direction of the gate runner 51. In contrast, the second linear gate portion 16 extends in the X direction, which is a direction orthogonal to the extension direction of the gate runner 51.

This example includes the gate trench portions 10 and first dummy trench portions 20-1 provided in an alternating manner in the Y direction. This example also includes second dummy trench portions 20-1 arranged along the Y direction and adjacent to the gate trench portions 10 and first dummy trench portions 20-1 in the X direction. The first and second dummy trench portions 20-1 each include a first linear dummy portion 24 extending in the X direction and a second linear dummy portion 26 extending in the Y direction. The first linear dummy portions 24 and the second linear dummy portions 26 intersect with each other.

The second dummy trench portions 20-1 are provided in columns in the Y direction that are adjacent to each other. The second linear dummy portion 26 of each second dummy trench portion 20-1 is sandwiched in the Y direction by a gate trench portion 10 and a first dummy trench portion 20-1. In this example, the shortest distance L between the second linear dummy portion 26 of a second dummy trench portion 20-1 and the +Y-direction end of the gate trench portion 10 is 0.2 μm. Furthermore, the shortest distance between the second linear dummy portion 26 of the second dummy trench portion 20-1 and the −Y-direction end of the first dummy trench portion 20-1 is 0.2 μm. In this way, it is possible to achieve the same effect as the example shown in FIG. 7.

In this example, each gate trench portion 10 is cross-shaped. The bottom portion of the intersecting portion of the cross shape is deeper than the bottom portion of the portions that do not intersect, in the same manner as in the dummy trench portions 20-1. In this example, the intersection portion of each gate trench portion 10 is surrounded by the intersecting portions of the cross shapes of the dummy trench portions 20-1 surrounding the gate trench portion 10. Therefore, the number of bottom portions of the intersecting portions of the dummy trench portions 20-1 that are arranged is greater than the number of bottom portions of intersecting portions of the gate trench portions 10. As a result, it is possible to realize a uniform distribution for the electrical field strength at the bottom portions of the intersecting portions, without having the electrical field focused in the gate trench portions 10.

Each emitter contact portion 62 provided on top of a dummy trench portion 20-1 is provided at a position on the dummy trench portion 20-1 that is not on top of the gate runner 51. The emitter contact portion 62 of this example is provided farther in the +X direction than the second linear dummy portion 26 positioned above the gate runner 51. In this way, the emitter potential can be supplied to the trench electrode 22 of the dummy trench portion 20-1. Furthermore, by moving a emitter contact portion 62 to be on top of the gate runner 51, a runner contact portion 52 may be realized instead of the emitter contact portion 62. In an opposite manner, by moving a runner contact portion 52 to a position that is not on top of the gate runner 51, an emitter contact portion 62 may be realized instead of the runner contact portion 52.

In this way, it becomes easy to change the shapes of the first dummy trench portions 20-1 into gate trench portions 10 and to change the shapes of the gate trench portions 10 into first dummy trench portions 20-1. In other words, by changing the positions of the contact portions, it is possible to change the surface area ratio of the gate trench portions 10 to the dummy trench portions 20. In this example, it is possible to both increase and decrease the surface area ratio. Therefore, the gate-emitter capacitance $C_{GE}$ can be adjusted according to the performance of the drive circuit.

Figure 13:
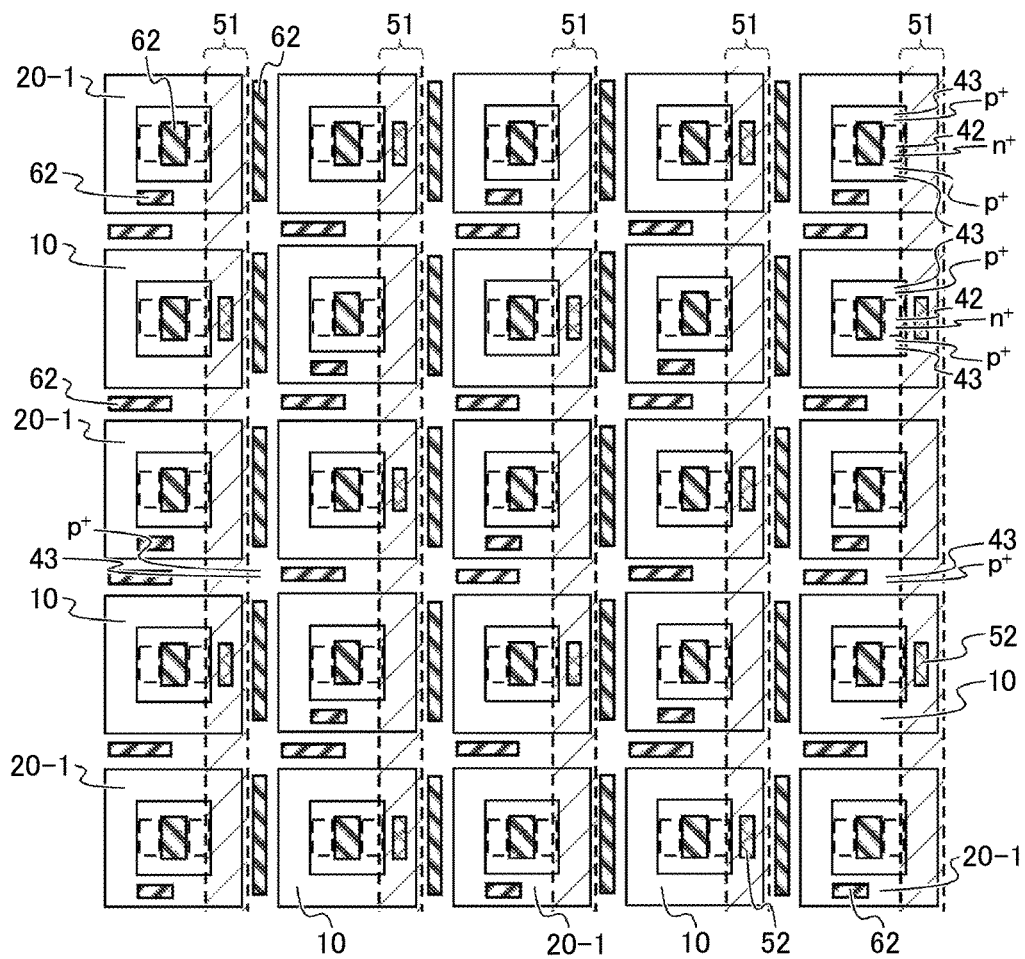
FIG. 13 is a schematic planar view of the transistor portion 80 according to the sixth embodiment.

FIG. 13 is a schematic planar view of a transistor portion 80 according to a sixth embodiment. Each gate trench portion 10 of this example is provided with a ring shape relative to the front surface 101 of the semiconductor substrate 40. Each dummy trench portion 20-1 is also provided with a ring shape, in the same manner as the gate trench portions 10. For each ring shape, the inner circumference may be 8 μm and the outer circumference may be 16 μm. Therefore, it is possible to treat the ring shapes as dot shapes. The gate trench portions 10 and the dummy trench portions 20-1 are arranged in an alternating manner in the X direction and the Y direction. In this way, each ring-shaped gate trench portion 10 is surrounded by four dummy trench portions 20-1 from four directions. In this example, the dummy trench portions 20-2 having the long portions are not included.

Each gate trench portion 10 has a square frame shape and includes a runner contact portion 52 on top of the gate runner 51. In contrast, each dummy trench portion 20-1 has a square frame shape and includes an emitter contact portion 62 at a position that is not on top of the gate runner 51. The emitter contact portion 62 is provided on the inner side of the square frame shape. Furthermore, two n$^+$-type emitter regions 42 are provided at positions sandwiching the emitter contact portion 62 in the X direction. Yet further, p$^+$-type contact regions 43 are provided directly below the emitter contact portion 62 and at positions sandwiching the n$^+$-type emitter regions 42 in the Y direction.

The region connected into the lattice shape between the gate trench portions 10 and the dummy trench portions 20-1 is a p$^+$-type contact region 43. Emitter contact portions 62 are provided on top of the p$^+$-type contact region 43. In this example, in the lattice-shaped p⁺-type contact region 43, a plurality of emitter contact portions 62 are provided in edge regions in the Y direction and X direction, i.e. regions other than the intersection points. The emitter contact portions 62 provided in the edge regions may be separated from each other.

With this example as well, it is possible to change the surface area ratio of the gate trench portions 10 to the dummy trench portions 20, by suitably switching the runner contact portions 52 of the gate trench portions 10 and the emitter contact portions 62 of the dummy trench portions 20-1. Therefore, the gate-emitter capacitance $C_{GE}$ can be adjusted according to the performance of the drive circuit.

Figure 14:
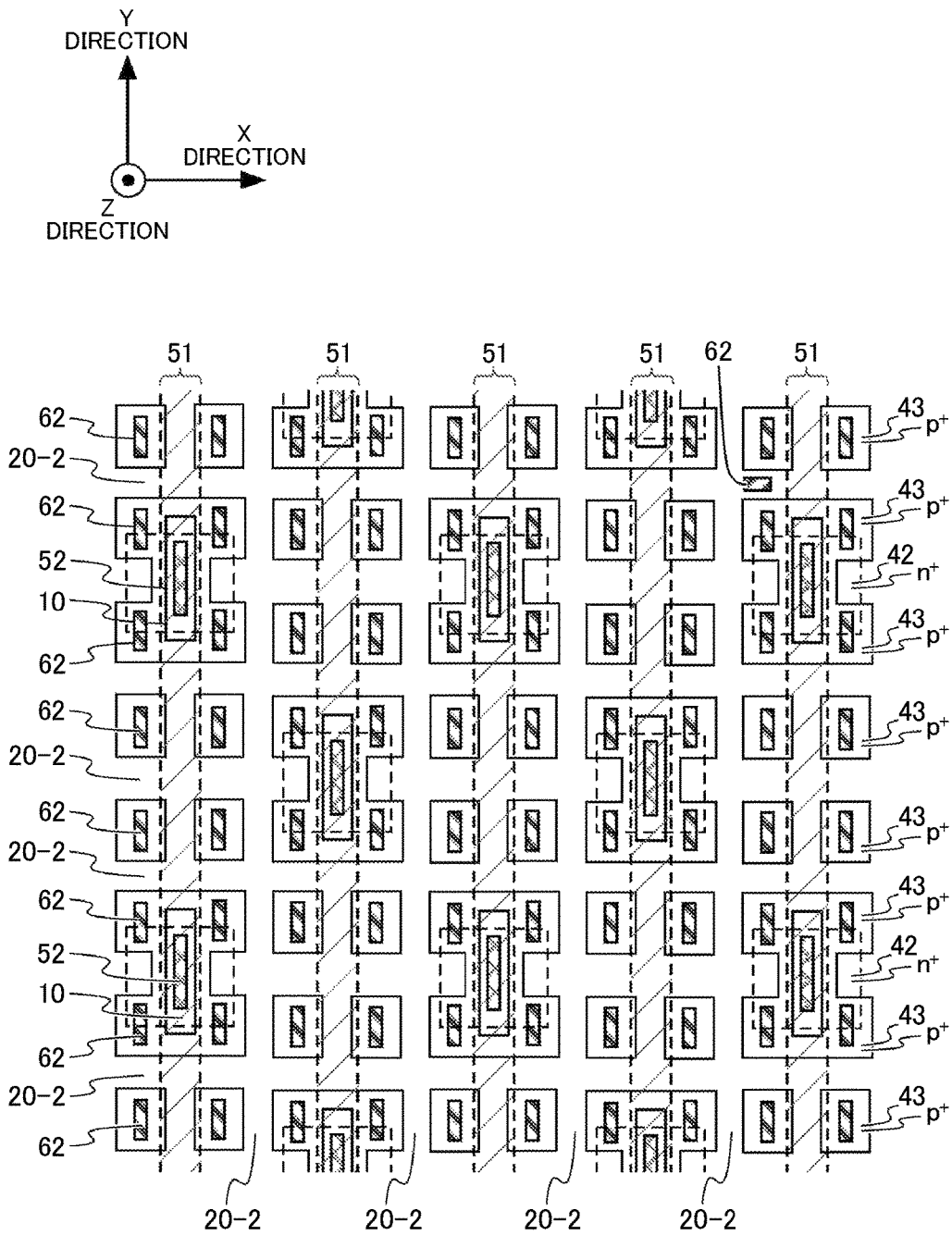
FIG. 14 is a schematic planar view of the transistor portion 80 according to the seventh embodiment.

FIG. 14 is a schematic planar view of a transistor portion 80 according to a seventh embodiment. This example corresponds to a modification of the fifth embodiment. In this example, the second linear gate portions 16 and dummy trench portions 20-1 of the fifth embodiment are changed to be dummy trench portions 20-2. Furthermore, in this example, in each dummy trench portion 20-2 of the fifth embodiment, the first linear dummy portion 24-2 extends in the Y direction and the second linear dummy portion 26-2 extends in the X direction. Therefore, all of the dummy trench portions 20-2 can be connected without segmentation. With this example as well, the gate-emitter capacitance $C_{GE}$ can be adjusted according to the performance of the drive circuit.

Figure 15:
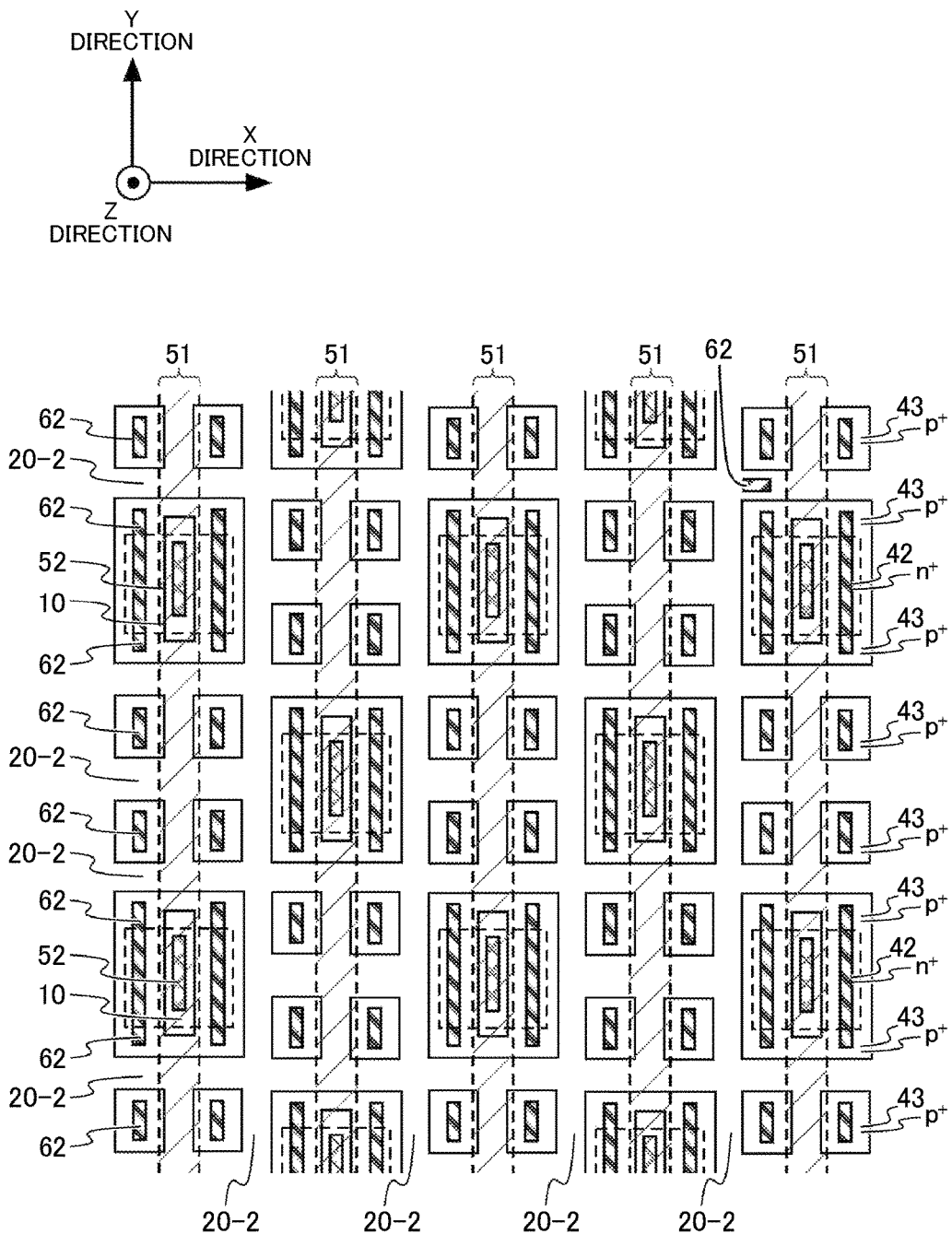
FIG. 15 is a schematic planar view of the transistor portion 80 according to the eighth embodiment.

FIG. 15 is a schematic planar view of a transistor portion 80 according to an eighth embodiment. This example corresponds to a modification of the seventh embodiment. In this example, the p⁺-type contact regions 43 around the gate trench portions 10 of the seventh embodiment are shaped as rectangles. In accordance with this, the emitter contact portions 62 provided on top of the p⁺-type contact regions 43 are extended in the Y direction and connected to each other. As a result, the four emitter contact portions 62 that surrounded each gate trench portion 10 in the seventh embodiment become two emitter contact portions 62. With this example as well, it is possible to realize the same effect as the seventh embodiment.

Figure 16:
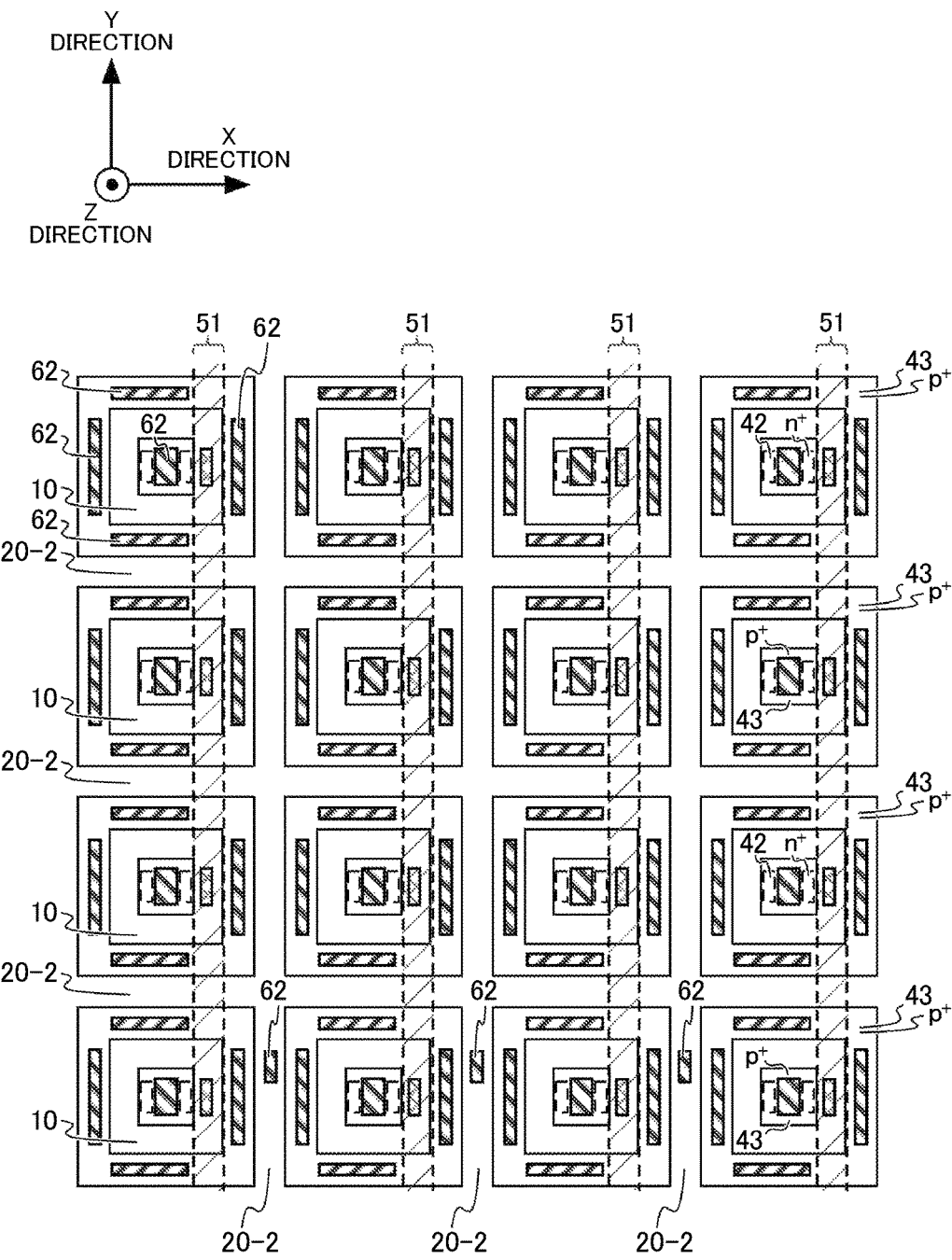
FIG. 16 is a schematic planar view of the transistor portion 80 according to the ninth embodiment.

FIG. 16 is a schematic planar view of a transistor portion 80 according to a ninth embodiment. This example is an embodiment resembling the sixth embodiment. However, in this example, the dummy trench portions 20-2 are provided but the dummy trench portions 20-1 are not provided. Furthermore, in this example, the p⁺-type contact regions 43 are provided as rectangular ring-shaped impurity injection regions, in a manner to surround the rectangular ring-shaped gate trench portions 10. Yet further, each ring-shaped p⁺-type contact region 43 is a unit cell, and a plurality of these unit cells are arranged in a matrix in the X direction and Y direction. In addition, dummy trench portions 20-2 are provided extending in the X direction and the Y direction, in a manner to separate the unit cells from each other. In this way, a single dummy trench portion 20-2 surrounds all of the gate trench portions 10.

With this example as well, it is possible to change the surface area ratio of the gate trench portions 10 to the dummy trench portions 20, by suitably replacing the runner contact portions 52 of the gate trench portions 10 with the emitter contact portions 62 of the dummy trench portions 20-1. In this way, the gate-emitter capacitance $C_{GE}$ can be adjusted according to the performance of the drive circuit.

Figure 17:
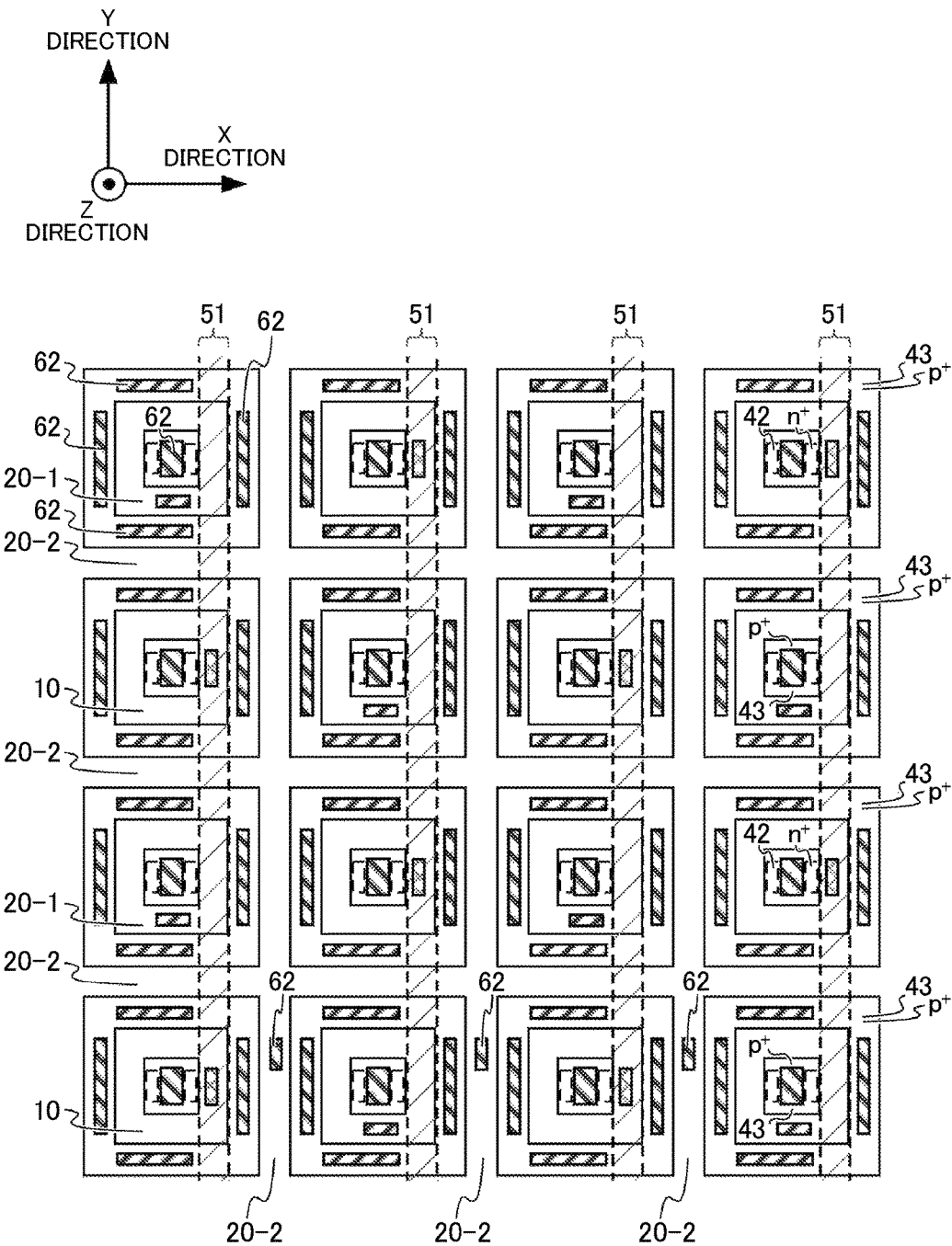
FIG. 17 is a schematic planar view of the transistor portion 80 according to the tenth embodiment.

FIG. 17 is a schematic planar view of a transistor portion 80 according to a tenth embodiment. In this example, some of the gate trench portions 10 in the ninth embodiment are set to be dummy trench portions 20-1. In particular, in this example, every other gate trench portion 10 in the X direction and the Y direction is set to be a dummy trench portion 20-1. The tenth embodiment differs from the ninth embodiment with regard to this point. With this example as well, the same effect as the ninth embodiment is realized.

Figure 18:
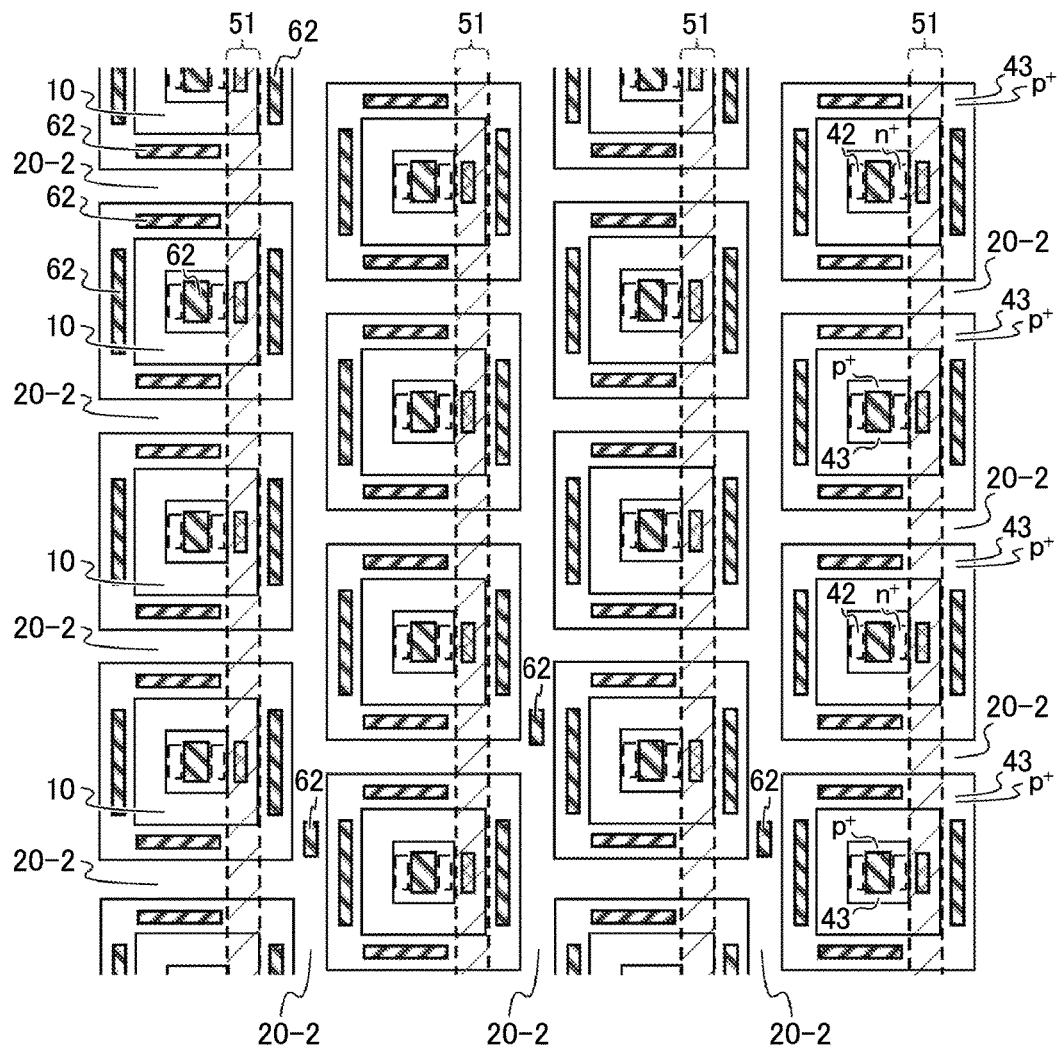
FIG. 18 is a schematic planar view of the transistor portion 80 according to the eleventh embodiment.

FIG. 18 is a schematic planar view of a transistor portion 80 according to an eleventh embodiment. In this example, ring-shaped p⁺-type contact regions 43 adjacent to each other in the X direction are provided at a half pitch in the Y direction. The eleventh embodiment differs from the ninth embodiment with regard to this point. With this example as well, the same effect as the ninth embodiment is realized.

Figure 19:
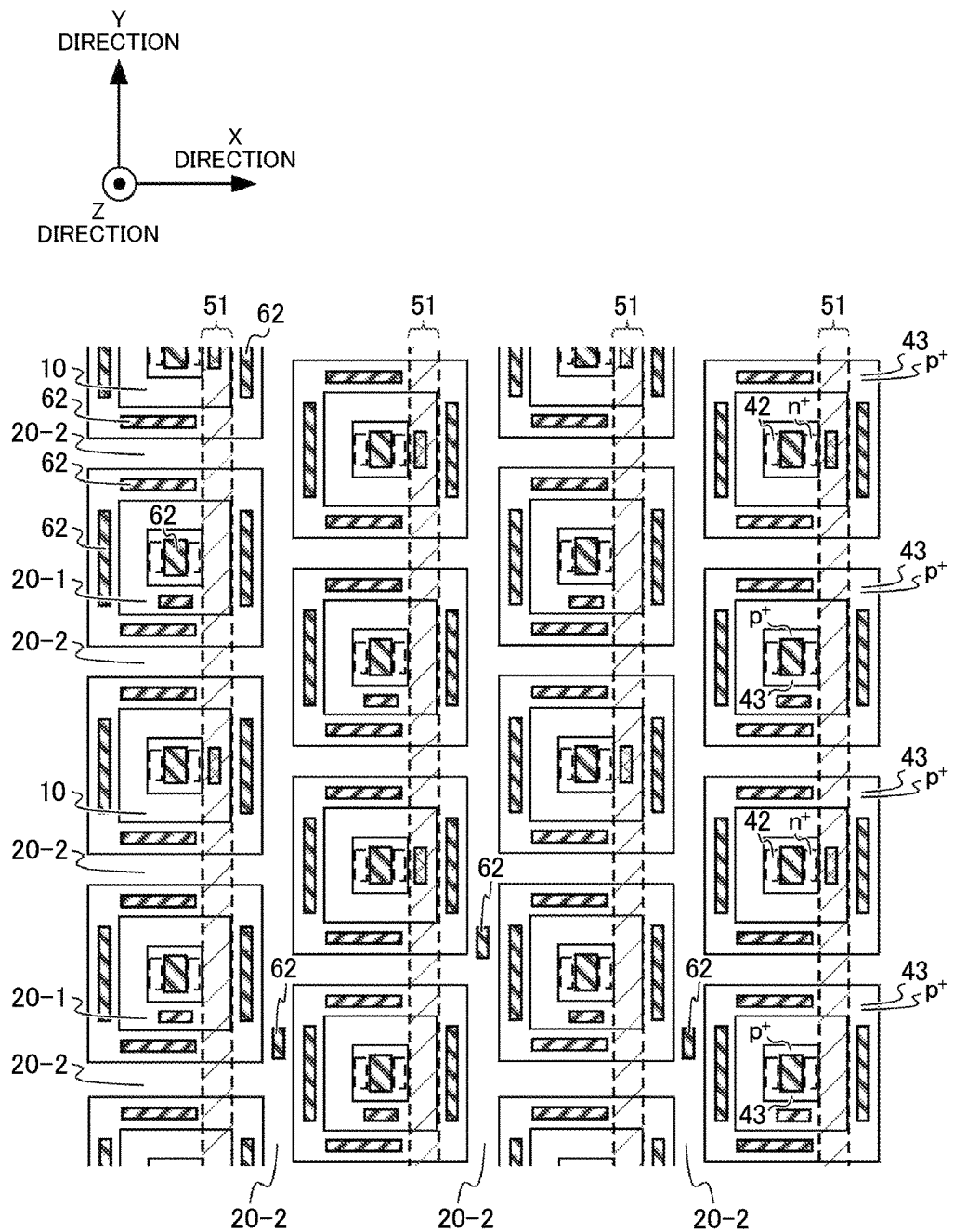
FIG. 19 is a schematic planar view of the transistor portion 80 according to the twelfth embodiment.

FIG. 19 is a schematic planar view of a transistor portion 80 according to a twelfth embodiment. In this example, ring-shaped p⁺-type contact regions 43 adjacent to each other in the X direction are provided at a half pitch in the Y direction. The twelfth embodiment differs from the tenth embodiment with regard to this point. With this example as well, the same effect as the tenth embodiment is realized.

Figure 20:
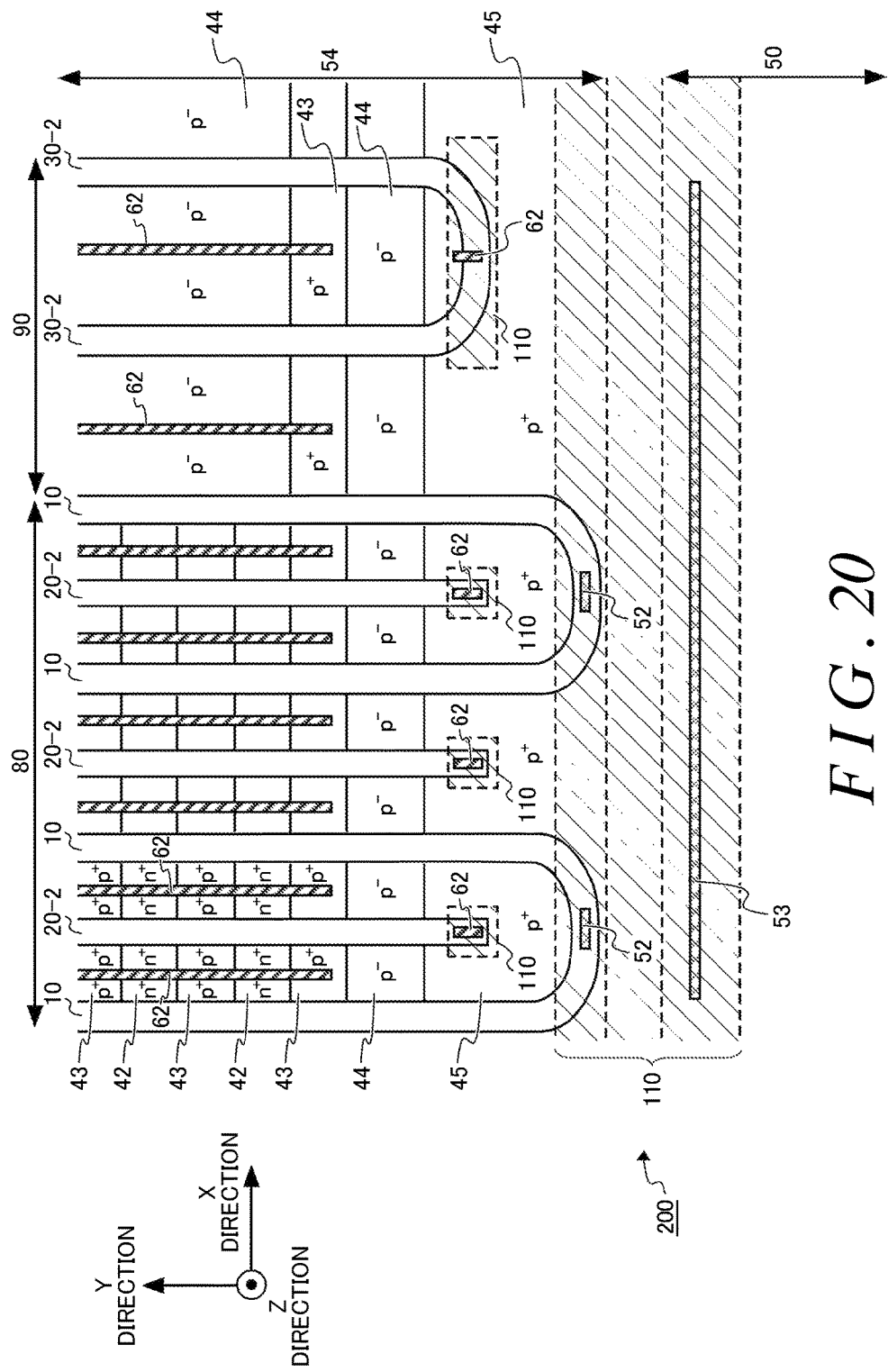
FIG. 20 is a schematic planar view of a top surface of a semiconductor device 200 according to a comparative example

FIG. 20 is a schematic planar view of a top surface of a semiconductor device 200 according to a comparative example. The transistor portion 80 of this example includes gate trench portions 10 and dummy trench portions 20-2. Furthermore, a diode portion 90 serving as a comparative example includes U-shaped emitter trench portions 30-2. The arrangement pattern for the p⁻-type base regions 44 and p⁺-type well regions is basically the same as the arrangement pattern shown in the example of FIG. 1. However, this example differs from the example of FIG. 1 in that the n⁺-type emitter regions 42 and the p⁺-type contact regions 43 are provided in an alternating manner at uniform intervals in the Y direction.

Each gate trench portion 10 in this example has long portions and a short portion in a U shape. The gate trench portions 10 of this example are not dot-shaped. The long portion of each gate trench portion 10 extends in the Y direction across the transistor portion 80. Each gate trench portion 10 is directly connected to a polysilicon layer 110 at a runner contact portion 52 of the short portion at the Y-direction end. The polysilicon layer 110 is directly connected to the gate electrode 50 at the runner contact portion 53.

Each dummy trench portion 20-2 has a long portion extending in the Y direction between the two long portions of a gate trench portion 10. The dummy trench portions 20-2 are also not dot-shaped. Each dummy trench portion 20-2 is directly connected to the emitter electrode 54 via the polysilicon layer 110 at an emitter contact portion 62 on the Y-direction end.

The short portion in the U shape of each emitter trench portion 30-2 is provided farther in the +Y direction than the polysilicon layer 110. Each emitter trench portion 30-2 is electrically connected to the emitter electrode 54 via the polysilicon layer 110 at an emitter contact portion 62.

Figure 21:
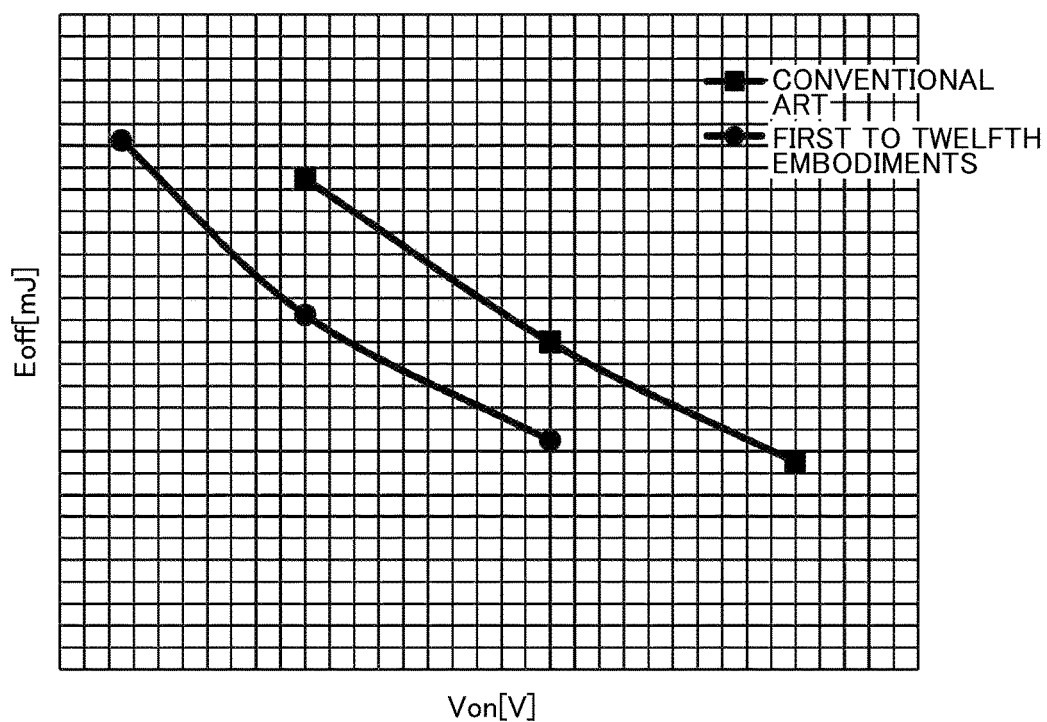
FIG. 21 shows the relationship between the ON voltage (Von) and the OFF loss (Eoff).

FIG. 21 shows the relationship between the ON voltage (Von) and the OFF loss (Eoff). The horizontal axis indicates the ON voltage [V]. The vertical axis indicates the loss [mJ] when the IGBT is switched OFF. In the first to twelfth embodiments, the IE effect can be realized by making the mesa width smaller than in the comparative example, and therefore the ON voltage can be made lower than in the comparative example.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

LIST OF REFERENCE NUMERALS

10: gate trench portion, 12: trench electrode, 13: trench insulating film, 14: first linear gate portion, 16: second linear gate portion, 20: dummy trench portion, 22: trench electrode, 23: trench insulating film, 24: first linear dummy portion, 26: second linear dummy portion, 30: emitter trench portion, 32: trench electrode, 33: trench insulating film, 40: semiconductor substrate, 42: $n^+$-type emitter region, 43: $p^+$-type contact region, 44: $p^-$-type base region, 45: $p^+$-type well region, 46: $n^-$-type drift layer, 47: $n^+$-type buffer layer, 48: $p^+$-type collector layer, 49: $n^+$-type cathode layer, 50: gate electrode, 51: gate runner, 52: runner contact portion, 53: runner contact portion, 54: emitter electrode, 56: collector electrode, 62: emitter contact portion, 72: first interlayer insulating film, 74: second interlayer insulating film, 80: transistor portion, 90: diode portion, 100: semiconductor device, 101: front surface, 102: back surface, 110: polysilicon layer, 200: semiconductor device

What is claimed is:

1. A semiconductor device comprising:
   a plurality of dummy trench portions that are provided in a front surface side of a semiconductor substrate and each have provided therein an electrode to which an emitter potential is supplied; and
   a gate trench portion that extends in a first direction and is provided in a manner to be sandwiched at least in the first direction by two or more dummy trench portions from among the plurality of dummy trench portions in the front surface side of the semiconductor substrate and has provided therein an electrode to which a gate potential is supplied.

2. The semiconductor device according to claim 1, further comprising:
   an emitter electrode that is provided such that at least a portion of the gate trench portion is arranged in a region directly below the emitter electrode, and has the emitter potential supplied thereto; and
   a gate runner that has at least a portion thereof provided below the emitter electrode and is electrically connected to the electrode provided within the gate trench portion, wherein
   the gate runner extends in a direction toward an outer circumference from the region directly below the emitter electrode.

3. The semiconductor device according to claim 2, wherein
   the gate trench portion and the dummy trench portions are provided in an alternating manner in an extension direction of the gate runner.

4. The semiconductor device according to claim 2, wherein
   the gate trench portion includes a linear gate portion that extends in an extension direction of the gate runner, and
   each of the dummy trench portions includes a linear dummy portion that extends in a direction orthogonal to the extension direction of the gate runner.

5. The semiconductor device according to claim 2, wherein
   the gate trench portion includes a first linear gate portion that extends in an extension direction of the gate runner and a second linear gate portion that extends in a direction orthogonal to the extension direction of the gate runner, and
   each of the dummy trench portions includes a first linear dummy portion that extends in an extension direction of the gate runner and a second linear dummy portion that extends in a direction orthogonal to the extension direction of the gate runner.

6. The semiconductor device according to claim 4, further comprising:
   contact portions for electrically connecting the electrodes provided in the dummy trench portions to the emitter electrode, wherein
   the contact portions are provided at positions on top of the dummy trench portions that are not on top of the gate runner.

7. The semiconductor device according to claim 1, wherein
   the gate trench portion and the dummy trench portions have a region where a closest distance therebetween is greater than or equal to a thickness of a trench insulating film and less than or equal to a width of the gate trench portion in a short direction.

8. The semiconductor device according to claim 1, wherein
   the gate trench portion is provided with a ring shape relative to the front surface of the semiconductor substrate.

9. The semiconductor device according to claim 3, wherein
   the gate trench portion and the dummy trench portions are provided in an alternating manner in a direction orthogonal to an extension direction of the gate runner.

10. The semiconductor device according to claim 8, further comprising:
    an impurity injection region that has a ring shape relative to the front surface of the semiconductor substrate and is provided in a manner to surround the ring-shaped gate trench portion, wherein
    a plurality of the impurity injection regions that each have a ring shape and are adjacent in a direction orthogonal to an extension direction of a gate runner to which the electrode provided in the gate trench portion is electrically connected are provided in a manner to be shifted by a half pitch in the extension direction of the gate runner.

11. The semiconductor device according to claim 2, wherein
    the gate runner extends above the at least a portion of the gate trench portion.

12. The semiconductor device according to claim 1, wherein
    the gate trench portion is provided in a manner to be further sandwiched in a second direction that is orthogonal to the first direction by two or more dummy trench portions from among the plurality of dummy trench portions.

13. The semiconductor device according to claim 1, wherein
each gate trench portion and the two or more dummy trench portions are arranged periodically in the first direction and a second direction that is orthogonal to the first direction.

14. The semiconductor device according to claim 1, wherein
the two or more dummy trench portions are cross-shaped dummy trench portions.

15. A semiconductor device comprising:
at least one dummy trench portion that is provided in a front surface side of a semiconductor substrate and each have provided therein an electrode to which an emitter potential is supplied; and
a gate trench portion that is provided in a manner to be surrounded by a continuous dummy trench portion from among the at least one dummy trench portion in the front surface side of the semiconductor substrate and has provided therein an electrode to which a gate potential is supplied.

16. The semiconductor device according to claim 15, further comprising:
an emitter electrode that is provided such that at least a portion of the gate trench portion is arranged in a region directly below the emitter electrode, and has the emitter potential supplied thereto; and
a gate runner that has at least a portion thereof provided below the emitter electrode and is electrically connected to the electrode provided within the gate trench portion, wherein
the gate runner extends in a direction toward an outer circumference from the region directly below the emitter electrode.

17. The semiconductor device according to claim 16, wherein
the gate runner extends above the at least a portion of the gate trench portion.

18. The semiconductor device according to claim 15, wherein
each gate trench portion is arranged periodically in a first direction and a second direction that is orthogonal to the first direction.

* * * * *